(12) United States Patent
Shirahata

(10) Patent No.: US 6,686,059 B2
(45) Date of Patent: Feb. 3, 2004

(54) SEMICONDUCTOR DEVICE MANUFACTURING METHOD AND SEMICONDUCTOR DEVICE

(75) Inventor: Masayoshi Shirahata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/960,329

(22) Filed: Sep. 24, 2001

(65) Prior Publication Data

US 2002/0102430 A1 Aug. 1, 2002

(30) Foreign Application Priority Data

Jan. 31, 2001 (JP) ........................................ 2001-023497

(51) Int. Cl.[7] .............................................. H01L 29/02
(52) U.S. Cl. ....................... 428/629; 428/450; 428/620; 428/446; 257/368; 257/382; 257/383; 257/384; 257/386
(58) Field of Search ................................ 428/629, 450, 428/620, 446; 257/368, 382, 383, 384, 386

(56) References Cited

U.S. PATENT DOCUMENTS 4,899,202 A * 2/1990 Blake et al. ............... 357/23.7
5,291,052 A * 3/1994 Kim et al. .................. 257/369
5,796,151 A   8/1998 Hsu et al.

FOREIGN PATENT DOCUMENTS

| JP | 5-3297    | 1/1993  |
| JP | 5-110003  | 4/1993  |
| JP | 6-342884  | 12/1994 |
| TW | 383474    | 3/2000  |

* cited by examiner

*Primary Examiner*—Deborah Jones
*Assistant Examiner*—Ling Xu
(74) *Attorney, Agent, or Firm*—Oblon, Spivak, McClelland, Maier & Neustadt, P.C.

(57) ABSTRACT

A semiconductor device having a reduced overlap capacity between a gate electrode and extensions. Specifically, a stacked structure made up of a polysilicon film, tungsten silicide film, and silicon nitride film is partially formed in first and second regions of a silicon substrate, respectively. Sidewall oxide films are formed on side surfaces of the polysilicon films in the first and second regions, respectively. A width of the sidewall of the first structure is smaller than a width of the sidewall of the second structure such that an overlap amount between a second conductive layer and a second impurity region is smaller than an overlap amount between a first conductive layer and a first impurity region.

3 Claims, 20 Drawing Sheets

F I G. 15
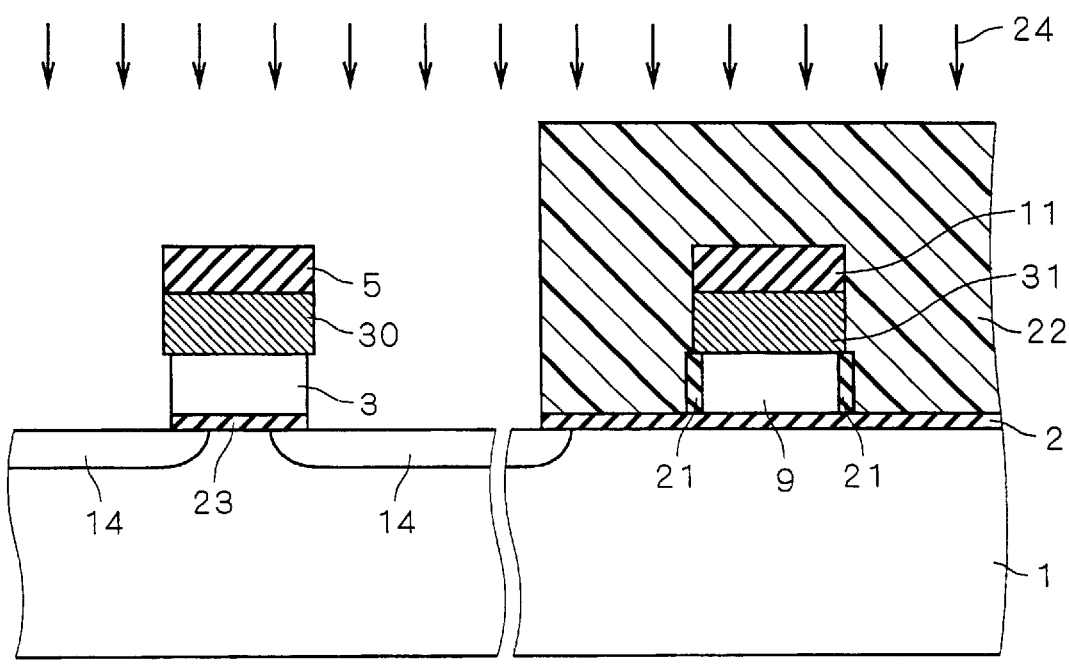
F I G. 16
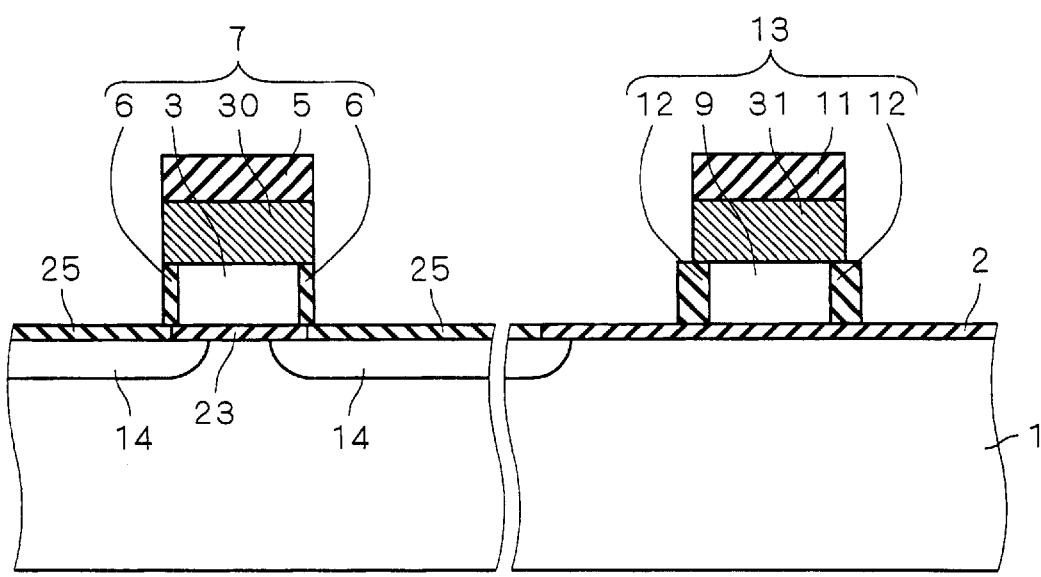

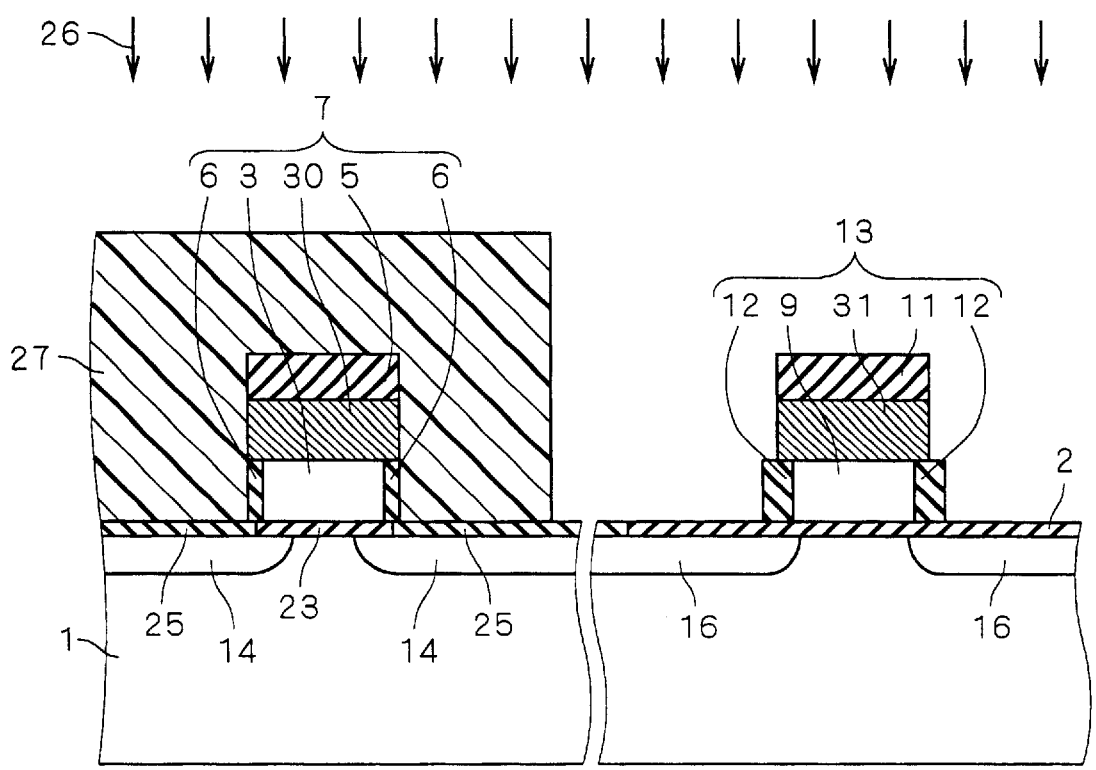
F I G . 17
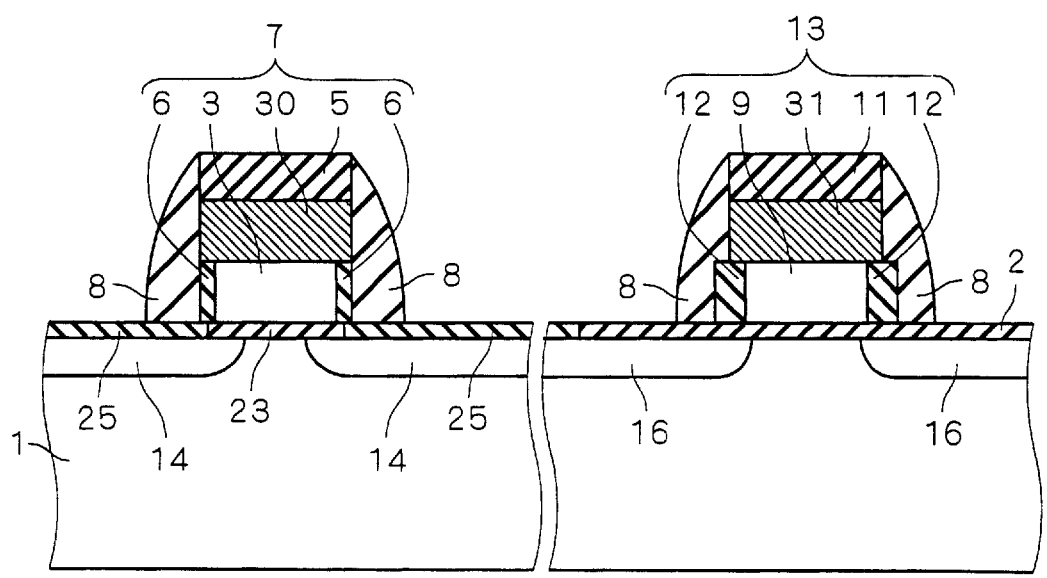
F I G . 18

F I G. 2 1
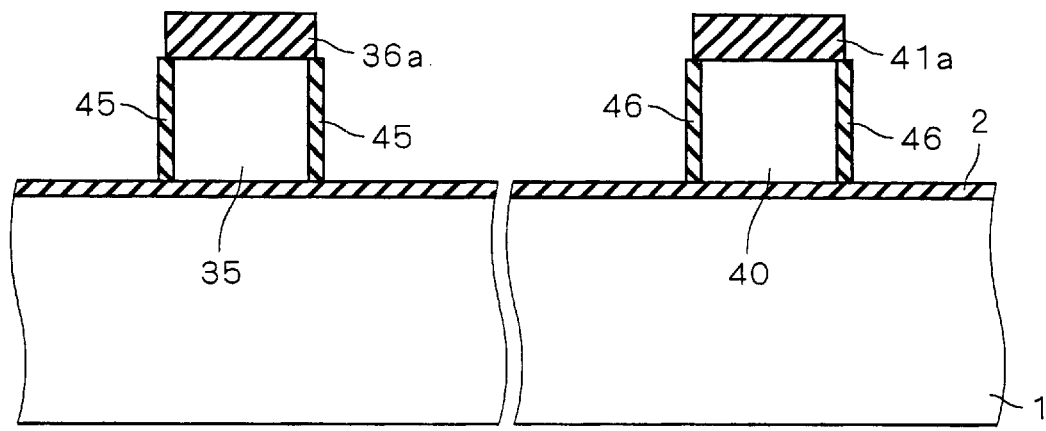
F I G. 2 2
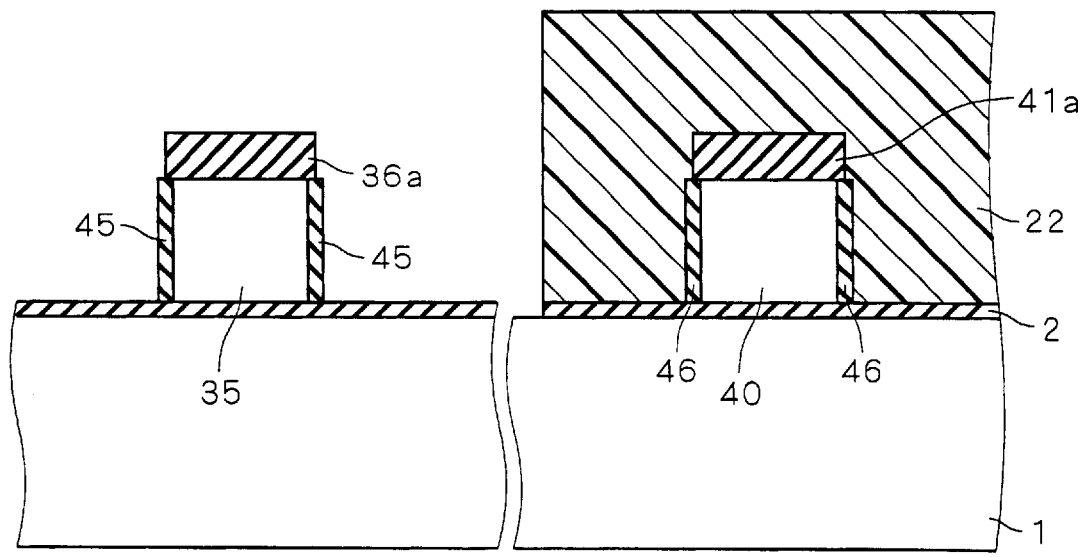

F I G. 23
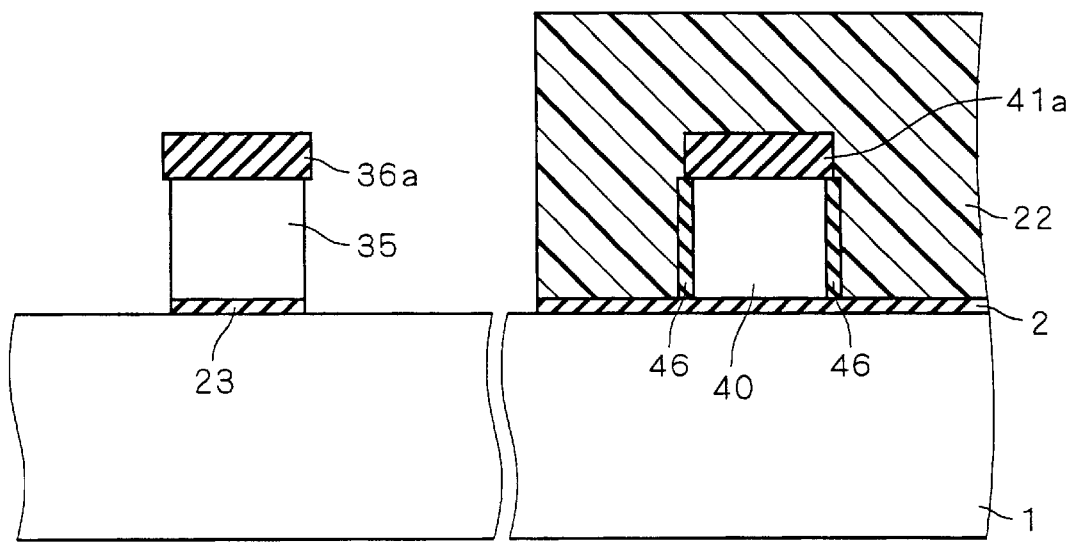
F I G. 24
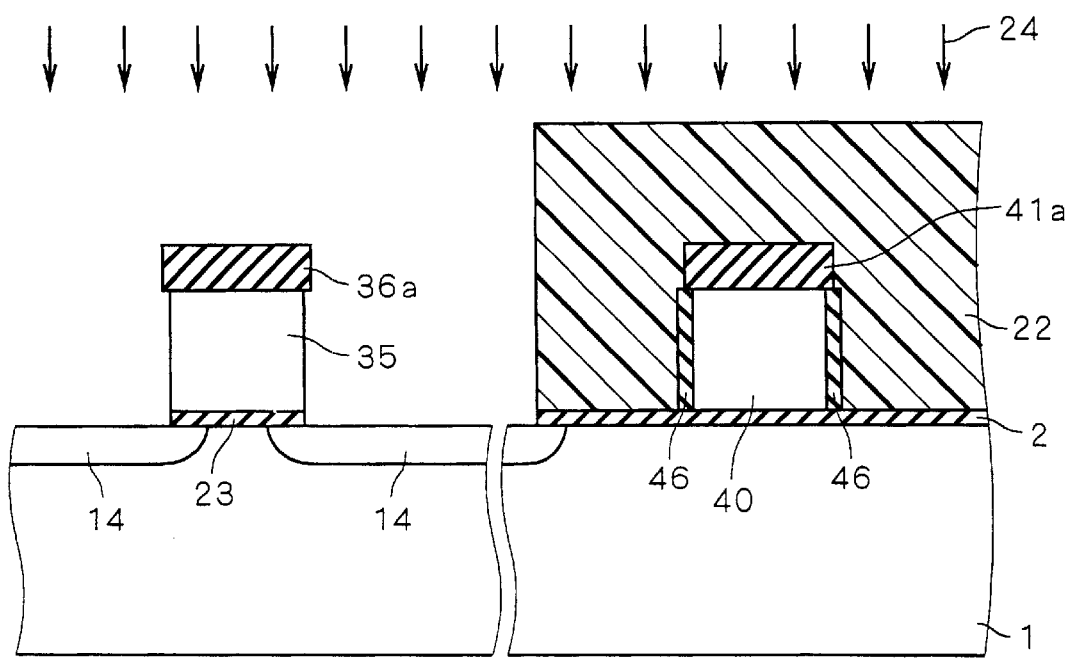

US 6,686,059 B2

SEMICONDUCTOR DEVICE MANUFACTURING METHOD AND SEMICONDUCTOR DEVICE

BACKGROUND OF THE INVENTION

1. Field of the Invention

The present invention relates to a method of manufacturing a semiconductor device and its structure. More particularly, the invention relates to a method of manufacturing a semiconductor device comprising a plurality of MOS transistors having different widths of a sidewall oxide film of a gate electrode, and a structure of a semiconductor device.

2. Description of the Background Art

In order to lower the cost of manufacturing LSIs and to increase the operation speed of LSIs, the scale down and high integration of LSIs have been proceeded. However, as such scale down is advanced, a variety of parasitic factors inhibit higher speed of operation. Among those, a main factor to decrease the operation speed of a circuit is a parasitic capacity formed by a gate electrode, a gate insulating film and an extension in a MOS transistor (hereinafter referred to as "gate overlap capacity" in the present specification).

To reduce the gate overlap capacity, it is necessary to reduce the amount of overlap between a gate electrode and an extension in plan view (i.e., the degree of overlap between the gate electrode and extension when viewed from above). As a technique to reduce the amount of overlap, it can be considered that an ion implantation for forming an extension is performed at a low energy. However, there is a limit of lowering the energy of ion implantation because when the depth of an extension decreases with a decrease in energy, the parasitic resistance increases and the amount of delay of operation speed increases.

FIG. 36 is a sectional view illustrating a conventional structure of a semiconductor device. A silicon oxide film 102 is formed on a main surface of a silicon substrate 101. A first MOS transistor (the transistor on the left side as viewed in FIG. 36) is formed in a first region of the silicon substrate 101, and a second MOS transistor (the transistor on the right side as viewed in FIG. 36) is formed in a second region of the silicon substrate 101.

The first MOS transistor comprises a gate structure 107 made up of a polysilicon film 103, tungsten silicide film 104, silicon nitride film 105 and sidewall oxide film 106; sidewall 108, extensions 114, source/drain region 115. The second MOS transistor comprises a gate structure 113 made up of a polysilicon film 109, tungsten silicide film 110, silicon nitride film 111 and sidewall oxide film 112; sidewall 108, extensions 116, source/drain region 117. The sidewall oxide films 106 and 112 have the same width. The spaced interval between the paired extensions 114 is the same as that between the paired extensions 116.

FIGS. 37 to 40 are sectional views illustrating a sequence of steps in a conventional method of manufacturing a semiconductor device. Referring to FIG. 37, a silicon oxide film 102 is formed on a main surface of a p-type silicon substrate 101, and a polysilicon film, a tungsten silicide film and a silicon nitride film are formed in the order named on the silicon oxide film 102. These layers are then patterned. Thereby, a structure that a polysilicon film 103, tungsten silicide film 104 and silicon nitride film 105 are stacked in the order named is formed in a first region of the silicon substrate 101, and a structure that a polysilicon film 109, tungsten silicide film 110 and silicon nitride film 111 are stacked in the order named is formed in a second region of the silicon substrate 101.

Referring to FIG. 38, by using these structures as an implantation mask, an n-type impurity 124 is implanted into the silicon substrate 101 through the silicon oxide film 102, thereby forming extensions 114 and 116.

Referring to FIG. 39, the side surfaces of the polysilicon films 103 and 109 are oxidized to form sidewall oxide films 106 and 112. The width of portions of the sidewall oxide films 106 and 112, which are formed inside from the original side surfaces of the polysilicon films 103 and 109, is approximately half of the width of the sidewall oxide films 106 and 112. Thus, the formation of the sidewall oxide films 106 and 112 by oxidizing the side surfaces of the polysilicon films 103 and 109 decreases the length (gate length) of the polysilicon films 103 and 109, thereby permitting a decrease in the amount of overlap between the extensions 114, 116 and the polysilicon films 103, 109.

Referring to FIG. 40, a sidewall 108 is formed on the side surfaces of the gate structures 107 and 113. By using the gate structures 107, 113 and the sidewall 108 as an implantation mask, an n-type impurity is implanted into the silicon substrate 101 through the silicon oxide film 102, to form source/drain regions 115 and 117. Through the foregoing steps, the structure shown in FIG. 36 is obtained.

In LSIs, various kinds of circuits are formed on a semiconductor substrate. Consider the case that a first MOS transistor shown in FIG. 36 constitutes a circuit on which current driving capability is emphasized, and a second MOS transistor shown in FIG. 36 constitutes a circuit on which operation speed is emphasized. For the second MOS transistor, it is desirable that the overlap capacity be reduced as much as possible by minimizing the amount of overlap between a polysilicon film 109 and an extension 116. For the first MOS transistor, it is unnecessary that the overlap capacity is excessively reduced at the sacrifice of current driving capability.

However, with the conventional method of manufacturing a semiconductor device, the sidewall oxide film 106 of the first MOS transistor has the same width as the sidewall oxide film 112 of the second MOS transistor. This results in the same effect of reducing the amount of overlap between polysilicon films 103, 109 and extensions 114, 116. It is therefore difficult to individually comply with demand of a circuit characteristic on which emphasis is placed.

SUMMARY OF THE INVENTION

According to a first aspect of the invention, a method of manufacturing a semiconductor device comprises the steps of: (a) preparing a substrate of a first conductivity type; (b) forming a first structure having a first conductive layer formed on a main surface of the substrate with an insulating film between, in a first region of the substrate; (c) forming a second structure having a second conductive layer formed on the main surface of the substrate with an insulating film between, in a second region of the substrate; (d) forming a first sidewall oxide film of a first width by oxidizing a side surface of the first conductive layer; (e) forming a second sidewall oxide film of a second width wider than the first width by oxidizing a side surface of the second conductive layer; (f) forming paired first impurity regions of a second conductivity type sandwiching therebetween the substrate underling the first structure, in the main surface in the first region of the substrate; and (g) forming paired second impurity regions of the second conductivity type sandwiching therebetween the substrate underling the second structure, in the main surface in the second region of the substrate, wherein the amount of overlap between the second conductive layer and the second impurity region in plan view is smaller than the amount of overlap between the first conductive layer and the first impurity region in plan view.

According to a second aspect of the invention, the method of the first aspect is characterized in that the steps (d) and (e) have the steps of: (de-1) forming a third sidewall oxide film by oxidizing the side surface of the first conductive layer, and forming a fourth sidewall oxide film by oxidizing the side surface of the second conductive layer; (de-2) removing the third sidewall oxide film; and (de-3) forming the first sidewall oxide film by oxidizing the side surface of the first conductive layer after removing the third sidewall oxide film, and forming the second sidewall oxide film by oxidizing the side surface of the second conductive layer provided with the fourth sidewall oxide film.

According to a third aspect of the invention, the method of the second aspect is characterized in that the step (f) is performed, after the step (de-2), by introducing impurity of the second conductivity type into the main surface in the first region of the substrate by using the first structure as a mask.

According to a fourth aspect of the invention, the method of the second aspect is characterized in that the step (f) is performed, before the step (de-2), by introducing impurity of the second conductivity type into the main surface in the first region of the substrate by using the first structure as a mask.

According to a fifth aspect of the invention, the method of the second aspect is characterized in that the step (g) is performed, after the step (de-3), by introducing impurity of the second conductivity type into the main surface in the second region of the substrate by using the second structure as a mask.

According to a sixth aspect of the invention, the method of the fifth aspect is characterized in that in the step (g) the impurity is introduced into the main surface in the first region of the substrate.

According to a seventh aspect of the invention, the method of the second aspect is characterized in that the steps (f) and (g) are performed in one step after the step (de-3).

According to an eighth aspect of the invention, the method of the first aspect is characterized in that the first and second conductive layers are semiconductor layers, and that the method further comprises the steps of: (x) forming a first metal layer on the first conductive layer; and (y) forming a second metal layer on the second conductive layer.

According to a ninth aspect of the invention, the method of the first aspect is characterized in that the first and second conductive layers are semiconductor layers, and that the method further comprises the steps of: (x) forming a first metal-semiconductor compound layer by performing silicide formation reaction of the first conductive layer; and (y) forming a second metal-semiconductor compound layer by performing silicide formation reaction of the second conductive layer.

According to a tenth aspect of the invention, a semiconductor device comprises a substrate of a first conductivity type; a first structure having a first conductive layer formed on a main surface in a first region of the substrate with an insulating film between; a second structure having a second conductive layer formed on the main surface in a second region of the substrate with an insulating film between; a first sidewall oxide film of a first width formed on a side surface of the first conductive layer; a second sidewall oxide film of a second width larger than the first width formed on a side surface of the second conductive layer; paired first impurity regions of a second conductivity type sandwiching therebetween the substrate underling the first structure and being formed in the main surface in the first region of the substrate; and paired second impurity regions of the second conductivity type sandwiching therebetween the substrate underling the second structure and being formed in the main surface in the second region of the substrate, wherein the amount of overlap between the second conductive layer and the second impurity region in plan view is smaller than the amount of overlap between the first conductive layer and the first impurity region in plan view.

According to an eleventh aspect of the invention, the semiconductor device of the tenth aspect is characterized in that the first and second conductive layer are semiconductor layers, that the first structure further having a first metal layer formed on the first conductive layer, and that the second structure further having a second metal layer formed on the second conductive layer.

According to a twelfth aspect of the invention, the semiconductor device of the tenth aspect is characterized in that the first and second conductive layers are semiconductor layers, and that the semiconductor device further comprises: a first metal-semiconductor compound layer formed on the first conductive layer; and a second metal-semiconductor compound layer formed on the second conductive layer.

In the first aspect, the first sidewall oxide film of the first width is formed in the first region of the substrate, and the second sidewall oxide film of the second width is formed in the second region of the substrate. Therefore, the amount of overlap between the first impurity region and the first conductive layer in the first region of the silicon substrate can be different from that between the second impurity region and second conductive layer in the second region.

In the second aspect, the first and second sidewall oxide films having different widths can be formed appropriately.

In the third aspect, the spaced interval between the paired first impurity regions can be narrowed, permitting an increase in current driving capability.

In the fourth aspect, the spaced interval between the paired first impurity regions can be widened, so that the effective channel length is increased and the gate overlap capacity is further reduced.

The fifth aspect enables to lower the amount of overlap between the second conductive layer and second impurity region in plan view.

The sixth aspect enables to omit the step of forming a photoresist on the first region of the substrate.

The seventh aspect enables to omit the step of successively forming a photoresist on the first and second regions of the substrate.

In the eighth aspect, the formation of the first and second metal layers enables to decrease the gate resistance.

In the ninth aspect, the formation of the first and second metal-semiconductor compound layers enables to decrease the gate resistance.

In the tenth aspect, since the spaced interval between the paired first impurity regions is narrower than that between the paired second impurity regions, a semiconductor element formed in the first region of the substrate can be used as a transistor constituting such a circuit that the emphasis is on current driving capability. On the other hand, since the spaced interval between the paired second impurity regions is wider than that between the paired first impurity regions, a semiconductor element formed in the second region of the substrate can be used as a transistor constituting such a circuit that the emphasis is on operation speed.

In the eleventh aspect, the presence of the first and second metal layers enables to decrease the gate resistance.

In the twelfth aspect, the presence of the first and second metal-semiconductor compound layers enables to decrease the gate resistance.

It is an object of the present invention to overcome the foregoing problem by providing a method of manufacturing a semiconductor device with which it is able to individually adjust the effect of reducing the overlap capacity between a gate electrode and extensions, according to demand of a circuit characteristic on which emphasis is placed, as well as a structure of a semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11 to 18 are sectional views illustrating a sequence of steps in a method of manufacturing a semiconductor device according to the second preferred embodiment;

FIGS. 20 to 28 are sectional views illustrating a sequence of steps in a method of manufacturing a semiconductor device according to the third preferred embodiment;

DESCRIPTION OF THE PREFERRED EMBODIMENTS

First Preferred Embodiment

Figure 1:
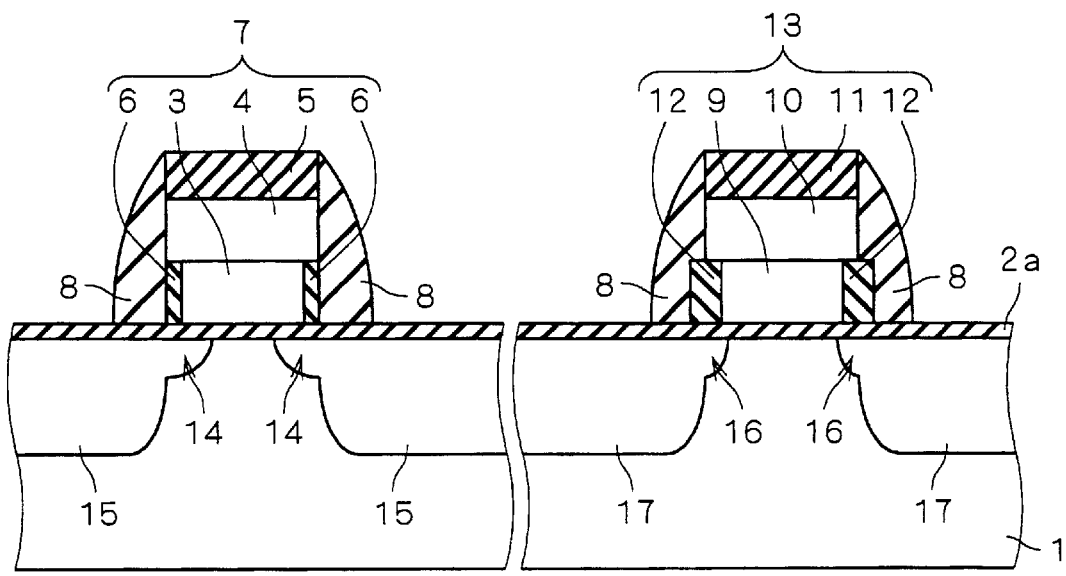
FIG. 1 is a sectional view illustrating a structure of a semiconductor device according to a first preferred embodiment of the invention.

FIG. 1 is a sectional view illustrating a structure of a semiconductor device according to a first preferred embodiment of the invention. A silicon oxide film 2a functioning as a gate insulating film is formed entirely on a main surface of a p-type silicon substrate 1. A first MOS transistor (the transistor on the left side as viewed in FIG. 1) is formed in a first region of the silicon substrate 1, and a second MOS transistor (the transistor on the right side as viewed in FIG. 1) is formed in a second region of the silicon substrate 1.

The first MOS transistor comprises a gate structure 7 partially formed on the silicon oxide film 2a; a sidewall 8 that is attached to the side surface of the gate structure 7 and formed on the silicon oxide film 2a; paired n-type extensions 14 that are formed so as to be relatively shallow in the main surface of the silicon substrate 1 and having sandwiched therebetween the silicon substrate 1 underlying the gate structure 7; and paired n-type source/drain regions 15 that are formed so as to be relatively deep in the main surface of the silicon substrate 1 and having sandwiched therebetween the silicon substrate 1 underlying the gate structure 7.

The gate structure 7 has a polysilicon film 3 formed on the silicon oxide film 2a; a tungsten silicide film 4 formed on the polysilicon film 3; a silicon nitride film 5 formed on the tungsten silicide film 4; and a sidewall oxide film 6 of a first width formed on the side surface of the polysilicon film 3.

The second MOS transistor comprises a gate structure 13 partially formed on the silicon oxide film 2a; a sidewall 8 that is attached to the side surface of the gate structure 13 and formed on the silicon oxide film 2a; paired n-type extensions 16 that are formed so as to be relatively shallow in the main surface of the silicon substrate 1 and having sandwiched therebeween the silicon substrate 1 underlying the gate structure 13; and paired n-type source/drain regions 17 that are formed so as to be relatively deep in the main surface of the silicon substrate 1 and having sandwiched therebetween the silicon substrate 1 underlying the gate structure 7. The spaced interval between the paired extensions 16 is larger than that of the paired extensions 14.

The gate structure 13 has a polysilicon film 9 formed on the silicon oxide film 2a; a tungsten silicide film 10 formed on the polysilicon film 9; a silicon nitride film 11 formed on the tungsten silicide film 10; and a sidewall oxide film 12 of a second width larger than the first width, which is formed on the side surface of the polysilicon film 9.

Figure 2:
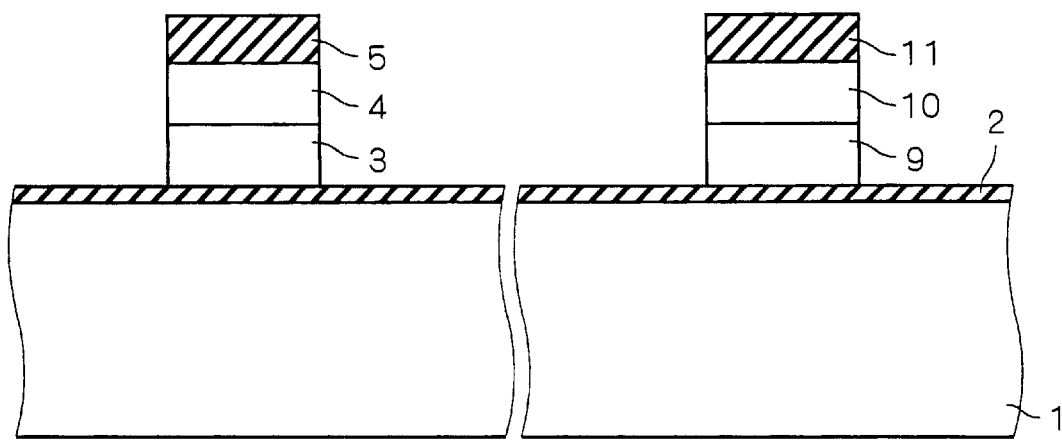
FIGS. 2 to 9 are sectional views illustrating a sequence of steps in a method of manufacturing a semiconductor device according to the first preferred embodiment.

FIGS. 2 to 9 are sectional views illustrating a sequence of steps in the method of manufacturing a semiconductor device according to the first preferred embodiment. Referring to FIG. 2, by a thermal oxidization method or the like, a silicon oxide film 2 having a thickness of about 3.5 nm is formed entirely on a main surface of a silicon substrate 1. By CVD method or the like, a polysilicon film having a thickness of about 70 nm, a tungsten silicide film having a thickness of about 70 nm and a silicon nitride film having a thickness of about 100 nm are formed in the order named on the entire surface. By photolithography method, a photoresist is formed on the silicon nitride film located in a region where gate structures 7 and 13 are to be formed. By using the photoresist as an etching mask, the silicon nitride film is removed until the tungsten silicide film is exposed, by an anisotropic dry etching method with which the etching rate is high in the direction of the depth of the silicon substrate 1. The photoresist is then removed. By using the remaining silicon nitride films 5 and 11 as a hard mask, the tungsten silicide film and polysilicon film are removed in this order until the silicon oxide film 2 is exposed, by an anisotropic dry etching method with which the etching rate is high in the direction of the depth of the silicon substrate 1. Thereby, a structure that a polysilicon film 3, tungsten silicide film 4 and silicon nitride film 5 are stacked in the order named on the silicon oxide film 2 is partially formed in the first region of the silicon substrate 1, and a structure that a polysilicon film 9, tungsten silicide film 10 and silicon nitride film 11 are stacked in the order named on the silicon oxide film 2 is partially formed in a second region of the silicon substrate 1.

Figure 3:
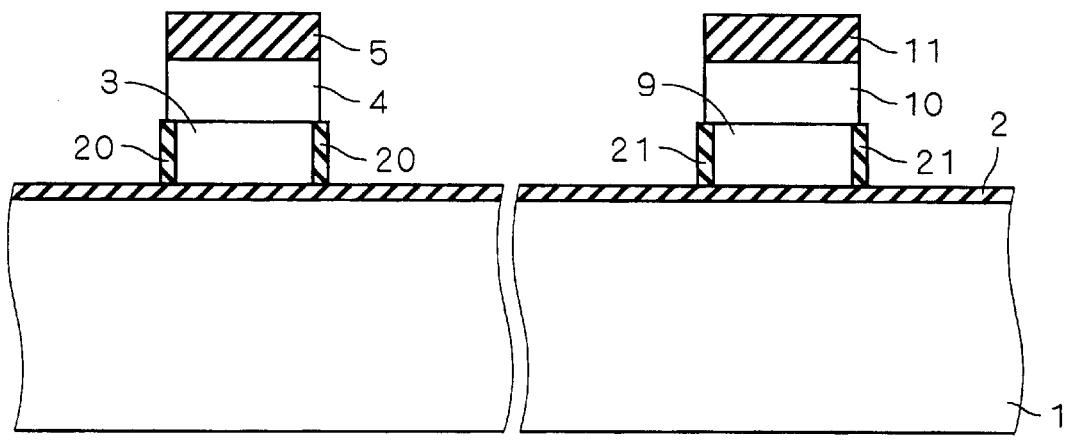

Referring to FIG. 3, the structure shown in FIG. 2 is subjected to a thermal oxidation. This results in that the side surface of the polysilicon film 3 is oxidized to form a sidewall oxide film 20 and that the side surface of the polysilicon film 9 is oxidized to form a sidewall oxide film 21. The sidewall oxide films 20 and 21 are formed from a silicon oxide film and have a width of about 3 nm. At this time, the side surfaces of the tungsten silicide films 4 and 10 and the main surface of the silicon substrate 1 are also oxidized slightly to form an oxide film, which is however omitted in FIG. 3, in order to simplify the drawing. In the following description, an oxide film to be formed on the silicon substrate 1 and the like by a thermal oxidation for forming a sidewall oxide film is omitted unless otherwise depicted.

Figure 4:
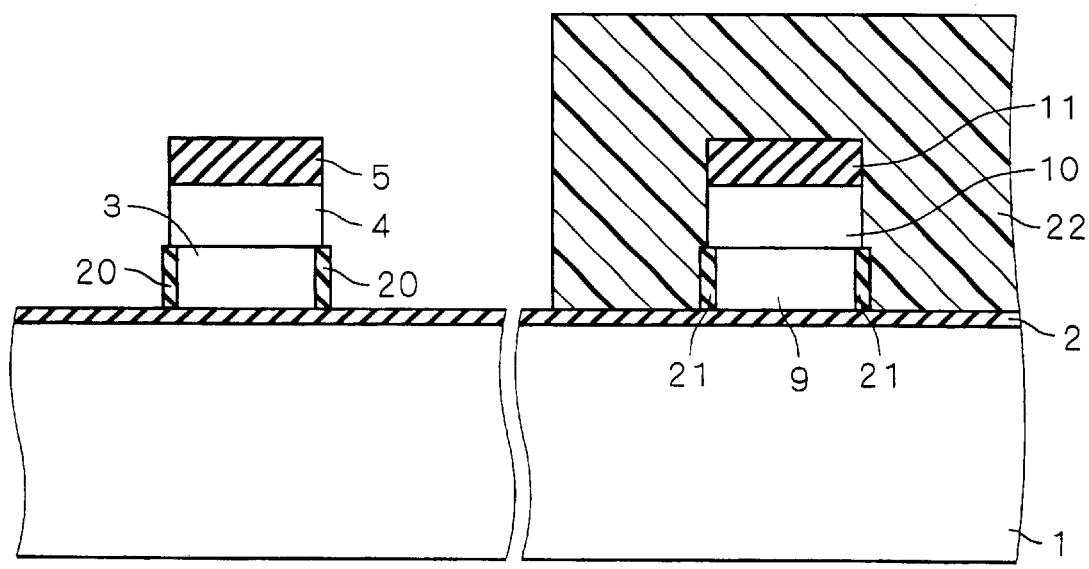

Referring to FIG. 4, a photoresist 22 is formed on the second region in the silicon substrate 1 by photolithography method, so that a structure made up of the polysilicon film 9, tungsten silicide film 10, silicon nitride film 11 and sidewall oxide film 21 is covered with the photoresist 22.

Figure 5:
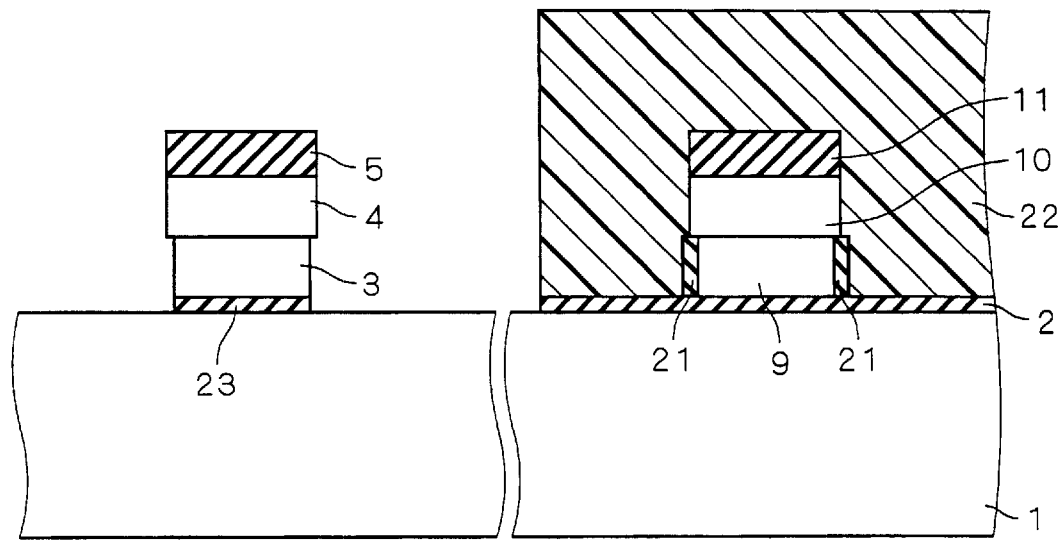

Referring to FIG. 5, portions of the silicon oxide film 2 and sidewall oxide film 20 which are not covered with the photoresist 22 are removed by wet etching method using hydrofluoric acid. At this time, portion of the silicon oxide film 2 which is an underlying layer of the polysilicon film 3 is not removed and remains as a silicon oxide film 23. The silicon oxide film 23 becomes a gate insulating film of the first MOS transistor.

Figure 6:
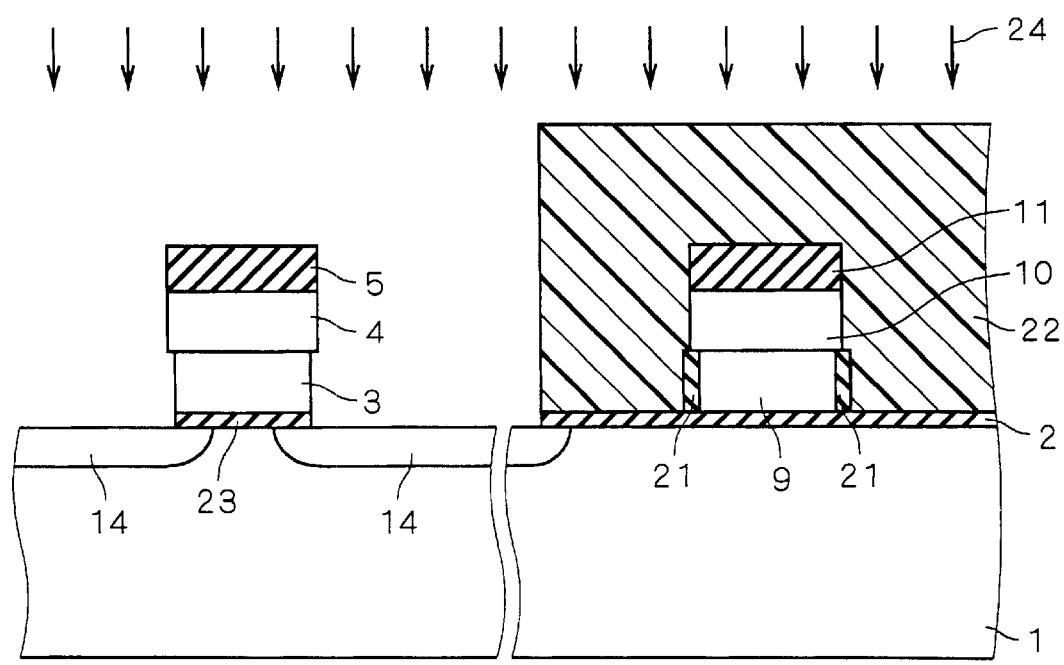

Referring to FIG. 6, by using, as an implantation mask, the photoresist 22 and the structure made up of the polysilicon film 3, tungsten silicide film 4 and silicon nitride film 5, an n-type impurity 24 such as As is introduced into the main surface of the silicon substrate 1 by ion implantation method under condition of 8 keV and $2\times10^{14}/cm^2$. Thereby, paired extensions 14 are formed in the main surface of the first region in the silicon substrate 1.

Figure 7:
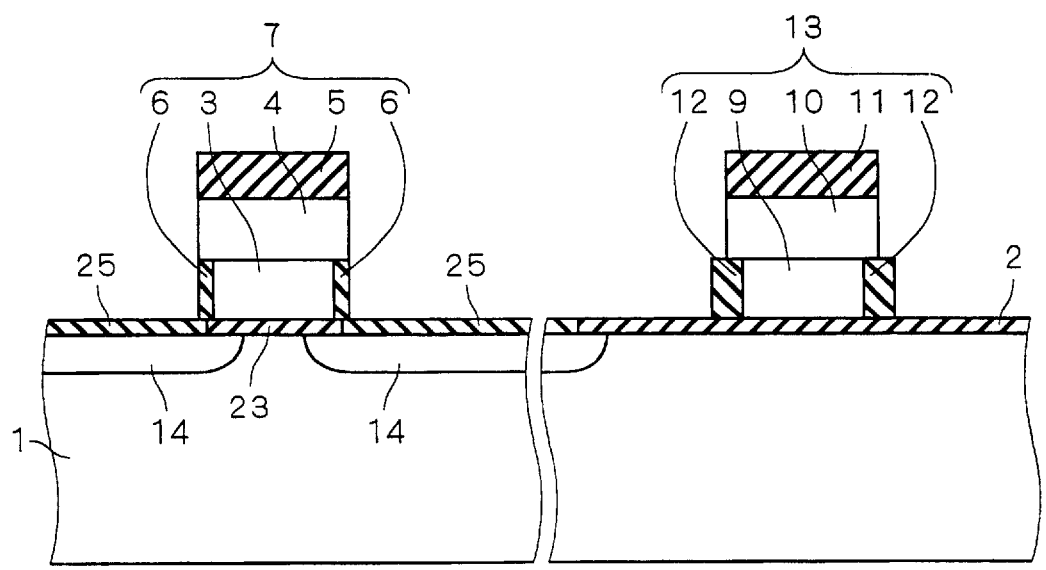

Referring to FIG. 7, after removing the photoresist 22, a thermal oxidation is performed so that the side surface of the polysilicon film 3 is oxidized to form a sidewall oxide film 6 having a width of about 3 nm. This results in a gate structure 7. Thus, the formation of the sidewall oxide film 6 by oxidizing the side surface of the polysilicon film 3 enables to reduce the length (gate length) of the polysilicon film 3, thus reducing the amount of overlap between the extensions 14 and polysilicon film 3. By this thermal oxidation, the main surface of the first region in the silicon substrate 1 is oxidized to form a silicon oxide film 25 having a thickness of about 3 nm. More specifically, the upper surface of the silicon oxide film 25 is lower than the upper surface of the silicon oxide film 23, and the lower surface of the silicon oxide film 25 is lower than the lower surface of the silicon oxide film 23. To simplify the drawing, such features are not depicted.

Further, by this thermal oxidation, the polysilicon film 9 is also oxidized, and the width of the sidewall oxide film 21 is increased to form a sidewall oxide film 12 having a width of about 5 nm. This results in a gate structure 13. The width of portion of the sidewall oxide film 12 which is formed inside from the original side surface of the polysilicon film 9 is approximately half (about 2.5 nm in this embodiment) of the width of the sidewall oxide film 12. More specifically, portion of the silicon oxide film 2 which is exposed from the gate structure 13 is also subjected to a thermal oxidization, and the thickness of such a portion is larger than the thickness of portion of the silicon oxide film 2 which is not exposed from the gate structure 13. Such features are not depicted to simplify the drawing.

Figure 8:
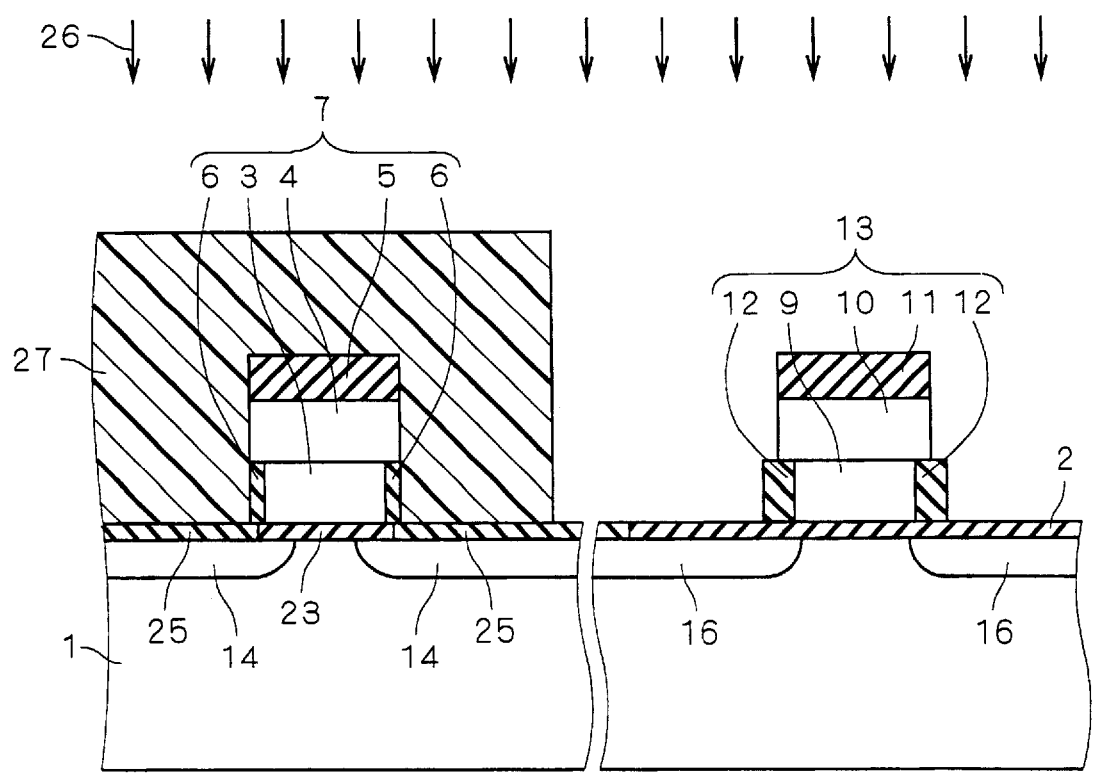

Referring to FIG. 8, a photoresist 27 is formed on the first region in the silicon substrate 1 by photolithography method, so that a gate structure 7 is covered with the photoresist 27. By using, as an implantation mask, the gate structure 13 and the photoresist 27, an n-type impurity 26 such as As is introduced into the main surface of the silicon substrate 1 by ion implantation method under condition of 5 keV and $1\times10^{14}/cm^2$. Thereby, paired extensions 16 are formed in the main surface of the second region in the silicon substrate 1. The condition of the ion implantation for forming the extensions 16 may be the same as that of the extensions 14. As shown in FIG. 8, although the extensions 16 is formed so as to underlie the gate structure 13, in the presence of the wide sidewall oxide film 12, the polysilicon film 9 and extensions 16 are hardly overlapped with each other in plan view. That is, as compared to the first MOS transistor, the amount of overlap between the polysilicon film 9 and extensions 16 is considerably reduced.

Figure 9:
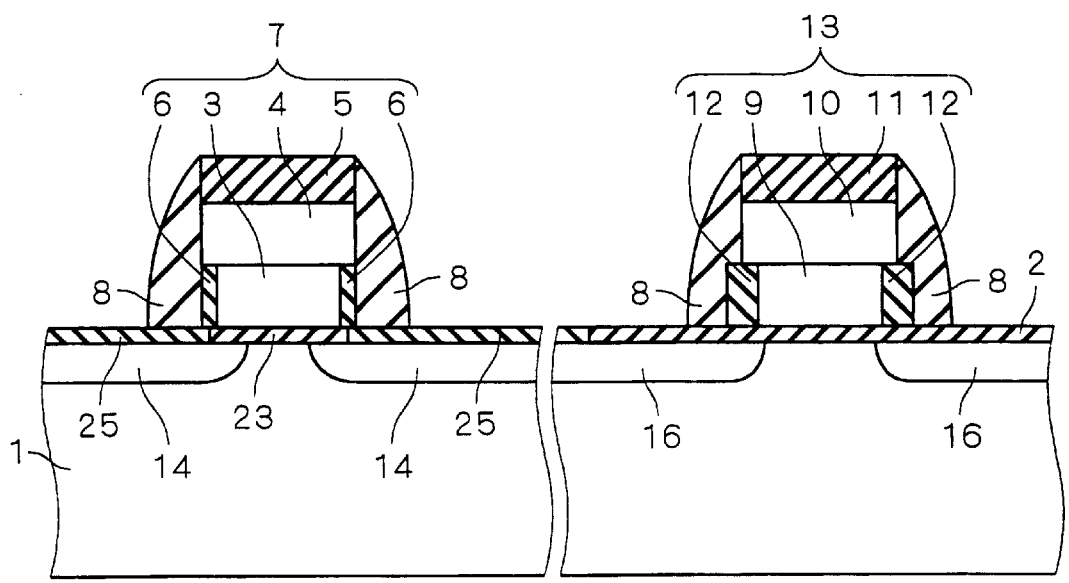

Referring to FIG. 9, after removing the photoresist 27, a silicon nitride film having a thickness of about 50 nm is formed on the entire surface by CVD method, etc. By an anisotropic dry etching method with which the etching rate is high in the direction of the depth of the silicon substrate 1, the silicon nitride film is removed to form a sidewall 8 attached to the side surfaces of the gate structures 7 and 13.

By using, as an implantation mask, the gate structures 7, 13 and the sidewall 8, an n-type impurity such as As is introduced into the main surface of the silicon substrate 1 by ion implantation method under condition of 50 keV and $5\times10^{15}/cm^2$. Thereby, paired source/drain regions 15 and 17 are formed in the main surface of the first and second regions of the silicon substrate 1, respectively. Through the foregoing steps, the structure shown in FIG. 1 is obtained. In FIG. 1, the silicon oxide films 25, 23 and 2 shown in FIG. 9 are generally designated by a silicon oxide film 2a.

Thus, with the method of manufacturing a semiconductor device in the first preferred embodiment, the sidewall oxide film 6 having the first width (about 3 nm in this embodiment) is formed in the first region of the silicon substrate 1, and the sidewall oxide film 12 having the second width (about 5 nm in this embodiment) different from the first width is formed in the second region of the silicon substrate 1. Therefore, the amount of overlap between the extensions 14, 16 and the polysilicon films 3, 9 can be different from each other in the first and second regions of the silicon substrate 1. This enables to individually adjust the effect of reducing the overlap capacity between the gate electrode and extensions according to demand of a circuit characteristic, such as current driving capability and operation speed, on which emphasis is placed.

The semiconductor device of the first preferred embodiment shown in FIG. 1 has the following features. Specifically, in the first MOS transistor the gate overlap capacity for every 1 $\mu$m of gate width is $1.5\times10^{-4}$ pF. In the second MOS transistor the gate overlap capacity for every 1 $\mu$m of gate width is $1.0\times10^{-4}$ pF, which is about 30% smaller than that of the first MOS transistor. Further, since in the second MOS transistor the length (gate length) of the polysilicon film 9 is short, the gate capacity is small. The second MOS transistor is suitable for high speed operation, and it can be used, for example, at the initial stage of an input circuit for inputting high frequency signals. As shown in FIG. 1, disposed on the polysilicon film 9 is the tungsten silicide film 10, the length in the gate length direction of which is larger than that of the polysilicon film 9. As a result, the second MOS transistor has a small gate resistance for its short gate length.

In the semiconductor device of the first preferred embodiment shown in FIG. 1, the parasitic resistance of the second MOS transistor (the resistance obtained by reducing the channel resistance from the source-drain resistance) is about 180 Ω. On the other hand, the parasitic resistance of the first MOS transistor is about 130 Ω, which is about 30% smaller than that of the second MOS transistor. Due to small parasitic resistance, the current driving capability of the first MOS transistor is about 5% higher than that of the second MOS transistor. Accordingly, the first MOS transistor can be used in a circuit for which high current driving capability is required, e.g., a circuit for driving load connected with a long distance wiring.

Second Preferred Embodiment

Figure 11:
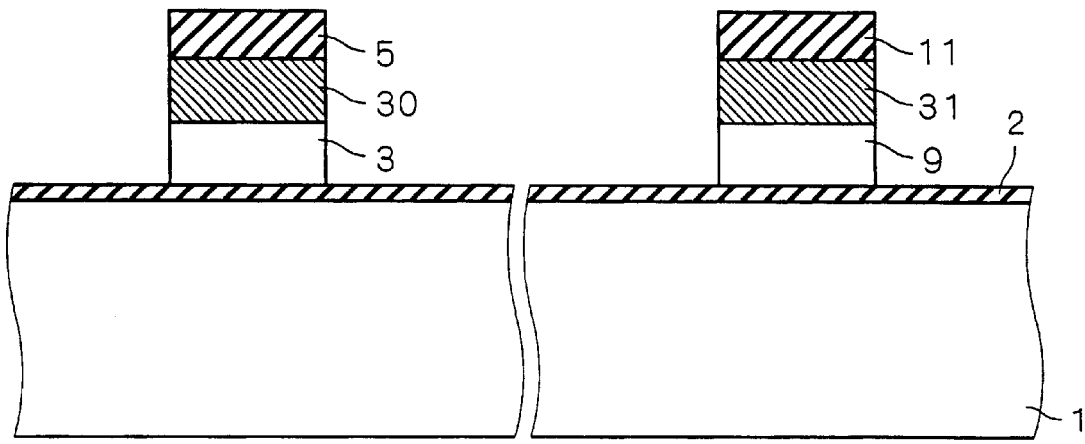

A method of manufacturing a semiconductor device according to the second preferred embodiment will be described particularly with regard to differences from the method of the first preferred embodiment. FIGS. 11 to 18 are sectional views illustrating a sequence of steps in the method of the second preferred embodiment. Referring to FIG. 11, a silicon oxide film 2 is formed entirely on a main surface of a silicon substrate 1. Subsequently, a polysilicon film, metal film (e.g., tungsten film) and silicon nitride film are formed entirely in the order named on the silicon oxide film 2. By using, as an etching mask, a photoresist formed on a region where gate structures 7 and 13 are to be formed, the silicon nitride film is subjected to an anisotropic dry etching, thereby forming silicon nitride films 5 and 11. After removing the photoresist, by using the remaining silicon nitride films 5 and 11 as an etching mask, the metal film and polysilicon film are subjected to an anisotropic dry etching. As a result, in a first region of the silicon substrate 1, a structure that a polysilicon film 3, metal film 30 and silicon nitride film 5 are stacked in the order named is partially formed on the silicon oxide film 2. In a second region of the silicon substrate 1, a structure that a polysilicon film 9, metal film 31 and silicon nitride film 11 are stacked in the order named is partially formed on the silicon oxide film 2.

Figure 12:
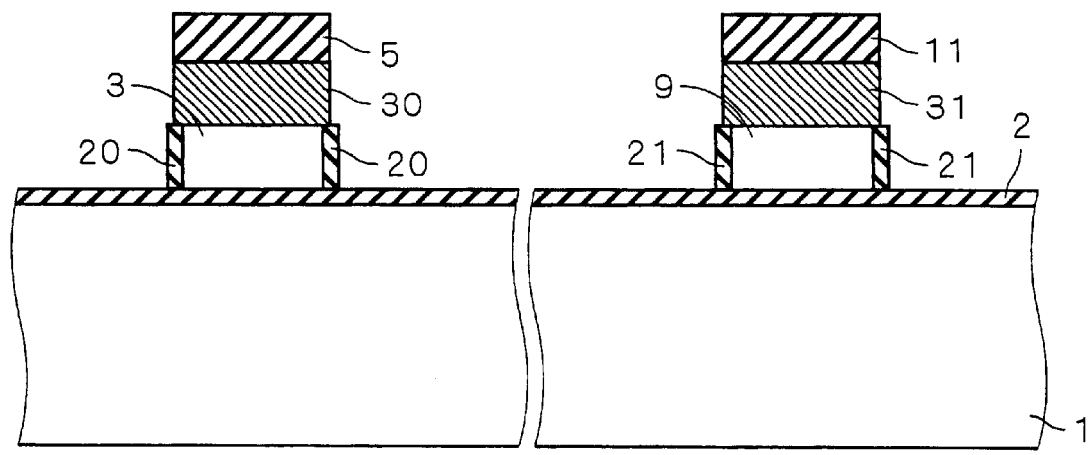

Referring to FIG. 12, the structure shown in FIG. 11 is subjected to a thermal oxidation under such a selective oxidation that metal is not oxidized and silicon is oxidized. For instance, the thermal oxidation is performed in an atmosphere that $H_2O$ gas and $H_2$ gas are mixed at a pressure ratio of $1:10^2$ to $1:10^4$, and the atmospheric pressure is reduced to the range of ambient pressure to about 133 Pa. Under this condition, the oxidation reaction of silicon is proceeded and the reduction reaction of tungsten is proceeded. As a result, the side surface of the polysilicon film 3 is oxidized to form a sidewall oxide film 20, and the side surface of the polysilicon film 9 is oxidized to form a sidewall oxide film 21. Note that the side surfaces of the metal films 30 and 31 are not oxidized.

Figure 13:
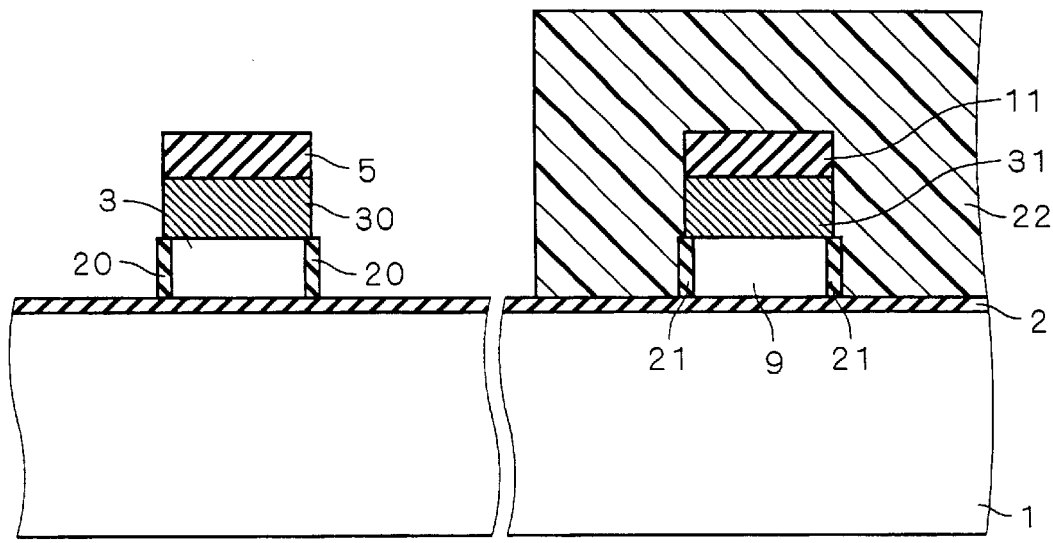
Figure 14:
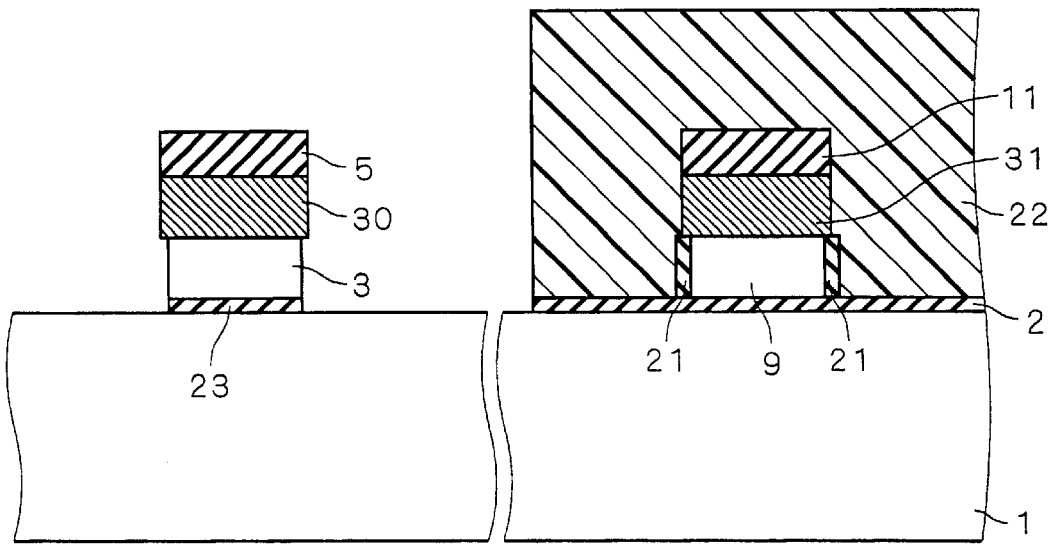

Referring to FIG. 13, a photoresist 22 is formed on the second region of the silicon substrate 1. Referring to FIG. 14, portions of the silicon oxide film 2 and sidewall oxide film 20 which are not covered with the photoresist 22 are removed. Referring to FIG. 15, by using, as an implantation mask, the photoresist 22 and the structure made up of the polysilicon film 3, metal film 30 and silicon nitride film 5, an n-type impurity 24 such as As is introduced into the main surface of the silicon substrate 1, thereby forming paired extensions 14. Referring to FIG. 16, after removing the photoresist 22, a thermal oxidation is performed under the above-mentioned selective oxidation, thereby forming a sidewall oxide film 6, silicon oxide film 25 and sidewall oxide film 12.

Figure 10:
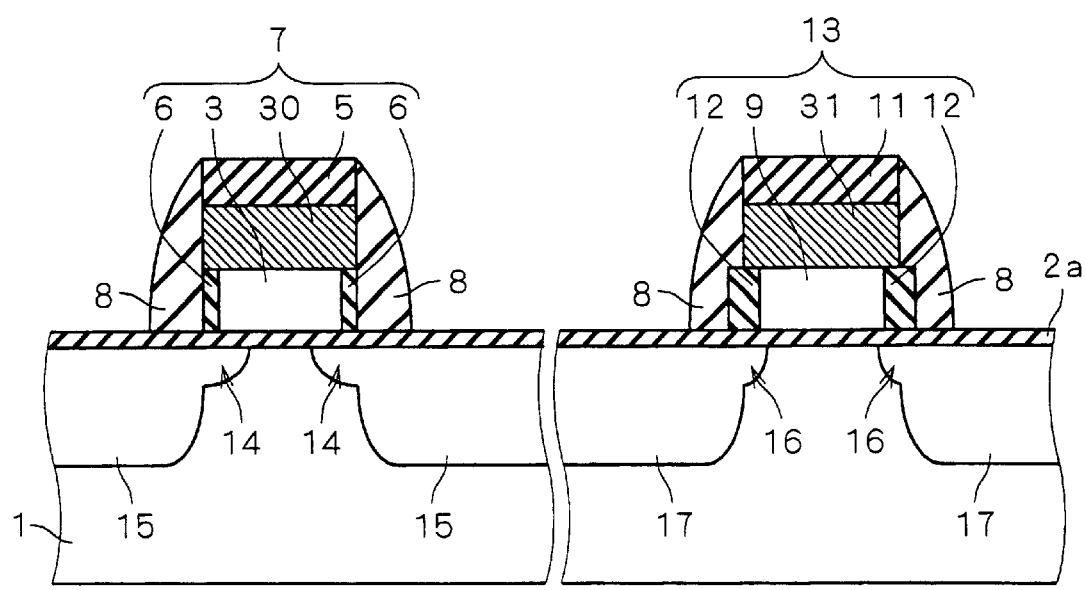
FIG. 10 is a sectional view illustrating a structure of a semiconductor device according to a second preferred embodiment.

Referring to FIG. 17, a photoresist 27 is formed on the first region of the silicon substrate 1. By using the gate structure 13 and photoresist 27 as an implantation mask, an n-type impurity 26 such as As is introduced into the main surface of the silicon substrate 1, thereby forming paired extensions 16. Referring to FIG. 18, after removing the photoresist 27, a sidewall 8 is formed. By using the gate structures 7 and 13 and the sidewall 8 as an implantation mask, an n-type impurity such as As is introduced into the main surface of the silicon substrate 1, thereby forming paired source/drain regions 15 and 17. Through the foregoing steps, the structure shown in FIG. 10 is obtained.

Like the method of the first preferred embodiment, with the method of the second preferred embodiment, the sidewall oxide film 6 of a first width is formed in the first region of the silicon substrate 1, and the sidewall oxide film 12 of a second width is formed in the second region of the silicon substrate 1. Therefore, the amount of overlap between the extensions 14, 16 and the polysilicon films 3, 9 can be different from each other in the first and second regions of the silicon substrate 1. This enables to individually adjust the effect of reducing the overlap capacity between the gate electrode and extensions according to demand of a circuit characteristic on which emphasis is placed.

In addition, with the method of the second preferred embodiment, the metal films 30 and 31 are disposed on the polysilicon films 3 and 9. It is therefore able to more reduce the gate resistance than the semiconductor device of the first preferred embodiment wherein the tungsten silicide films 4 and 10 are disposed on the polysilicon films 3 and 9.

Third Preferred Embodiment

Figure 19:
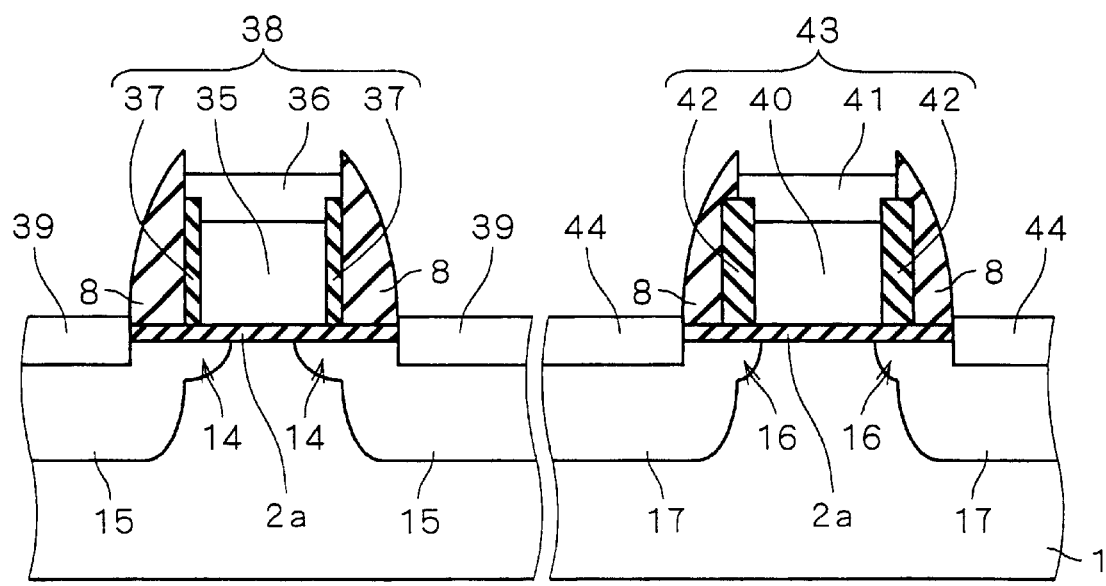
FIG. 19 is a sectional view illustrating a structure of a semiconductor device according to a third preferred embodiment.

FIG. 19 is a sectional view illustrating a structure of a semiconductor device according to a third preferred embodiment. A first MOS transistor comprises a gate structure 38 partially formed on a silicon oxide film 2a; a sidewall 8 attached to the side surface of the gate structure 38 and formed on the silicon oxide film 2a; and extensions 14 and source/drain regions 15 which are similar to that of the first preferred embodiment. The gate structure 38 has a polysilicon film 35 formed on the silicon oxide film 2a, a cobalt silicide film 36 formed on the polysilicon film 35, and a sidewall oxide film 37 of a first width formed on the side surface of the polysilicon film 35. A cobalt silicide film 39 is formed on portions of the source/drain regions 15 which are exposed from the gate structure 38 and sidewall 8.

A second MOS transistor comprises a gate structure 43 partially formed on the silicon oxide film 2a; a sidewall 8 attached to the side surface of the gate structure 43 and formed on the silicon oxide film 2a; and extensions 16 and source/drain region 17 which are similar to that of the first preferred embodiment. The gate structure 43 has a polysilicon film 40 formed on the silicon oxide film 2a, a cobalt silicide film 41 formed on the polysilicon film 40, and a sidewall oxide film 42 of a second width larger than the first width formed on the side surface of the polysilicon film 40. A cobalt silicide film 44 is formed on portions of the source/drain regions 17 which are exposed from the gate structure 43 and sidewall 8.

Figure 20:
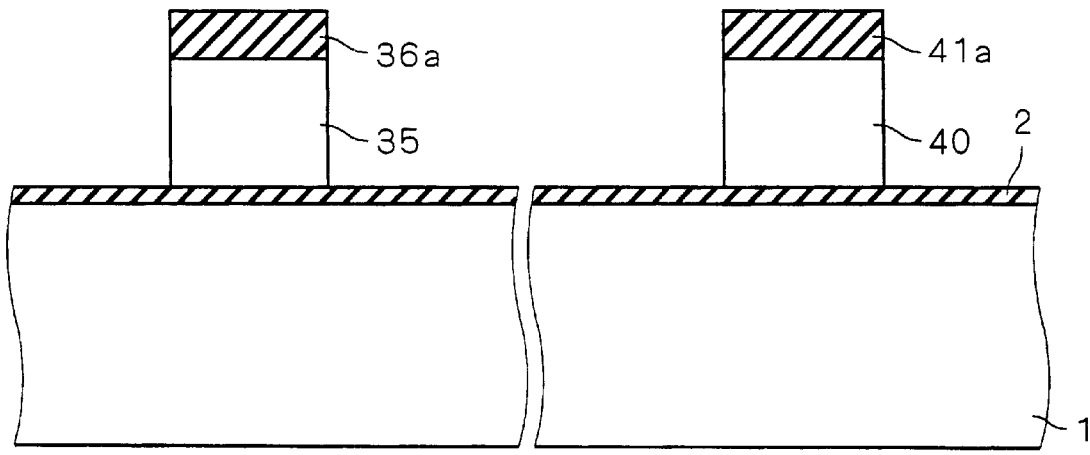

FIGS. 20 to 28 are sectional views illustrating a sequence of steps in a method of manufacturing a semiconductor device according to the third preferred embodiment. Referring to FIG. 20, a silicon oxide film 2 is formed entirely on a main surface of a silicon substrate 1 by thermal oxidation method or the like. A polysilicon film and TEOS (tetraethyl orthosilicate) film are formed in this order on the entire surface by CVD method or the like. By photolithography method, a photoresist is formed on a TEOS film in a region where gate structures 38 and 43 are to be formed. By using the photoresist as an etching mask, the TEOS film and polysilicon film are removed in this order until the silicon oxide film 2 is exposed, by an anisotropic dry etching method with which the etching rate is high in the direction of the depth of the silicon substrate 1. The photoresist is then removed. Thereby, in the first region of the silicon substrate 1, a structure that a polysilicon film 35 and TEOS film 36a are stacked in this order is partially formed on the silicon oxide film 2. In the second region of the silicon substrate 1, a structure that a polysilicon film 40 and TEOS film 41a are stacked in this order is partially formed on the silicon oxide film 2.

Referring to FIG. 21, the structure shown in FIG. 20 is subjected to a thermal oxidation. Thereby, the side surface of the polysilicon film 35 is oxidized to form a sidewall oxide film 45, and the side surface of the polysilicon film 40 is oxidized to form a sidewall oxide film 46. Referring to FIG. 22, by photolithography method, a photoresist 22 is formed on the second region of the silicon substrate 1, so that a structure made up of the polysilicon film 40, TEOS film 41a and sidewall oxide film 46 is covered with the photoresist 22.

Referring to FIG. 23, portions of the silicon oxide film 2 and sidewall oxide film 45 which are not covered with the photoresist 22 are removed by wet etching method using hydrofluoric acid. Referring to FIG. 24, by using, as an implantation mask, the photoresist 22 and the structure made up of the polysilicon film 35 and TEOS film 36a, an n-type impurity 24 such as As is introduced into the main surface of the silicon substrate 1 by ion implantation method, thereby forming extensions 14.

Figure 25:
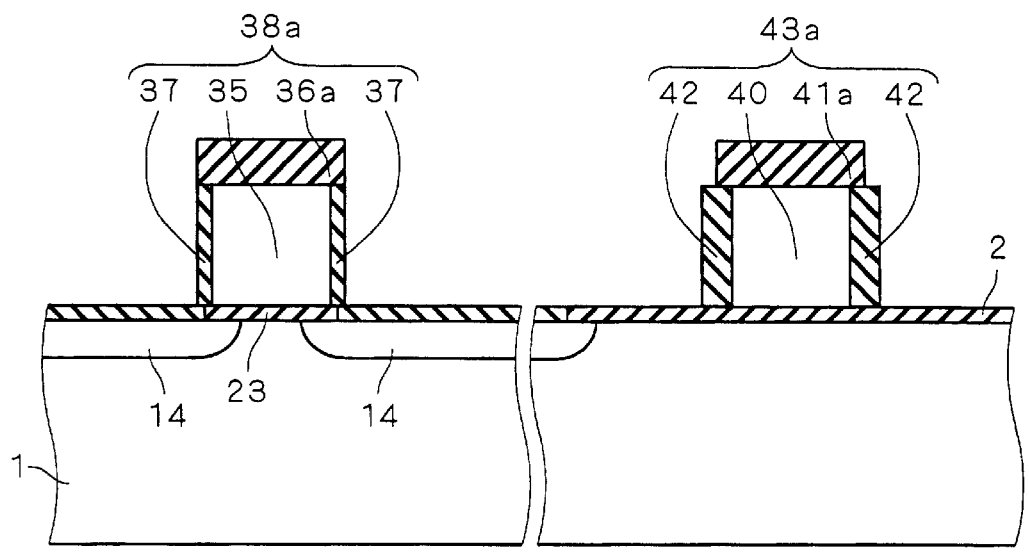

Referring to FIG. 25, after removing the photoresist 22, a thermal oxidation is performed, so that the side surface of the polysilicon film 35 is oxidized to form a sidewall oxide film 37. This results in a gate structure 38a. By this thermal oxidation, the main surface located in the first region of the silicon substrate 1 is also oxidized to form a silicon oxide film 25. Further, by this thermal oxidation, the polysilicon film 40 is also oxidized, so that the width of the sidewall oxide film 46 is increased to form a sidewall oxide film 42. This results in a gate structure 43a.

Figure 26:
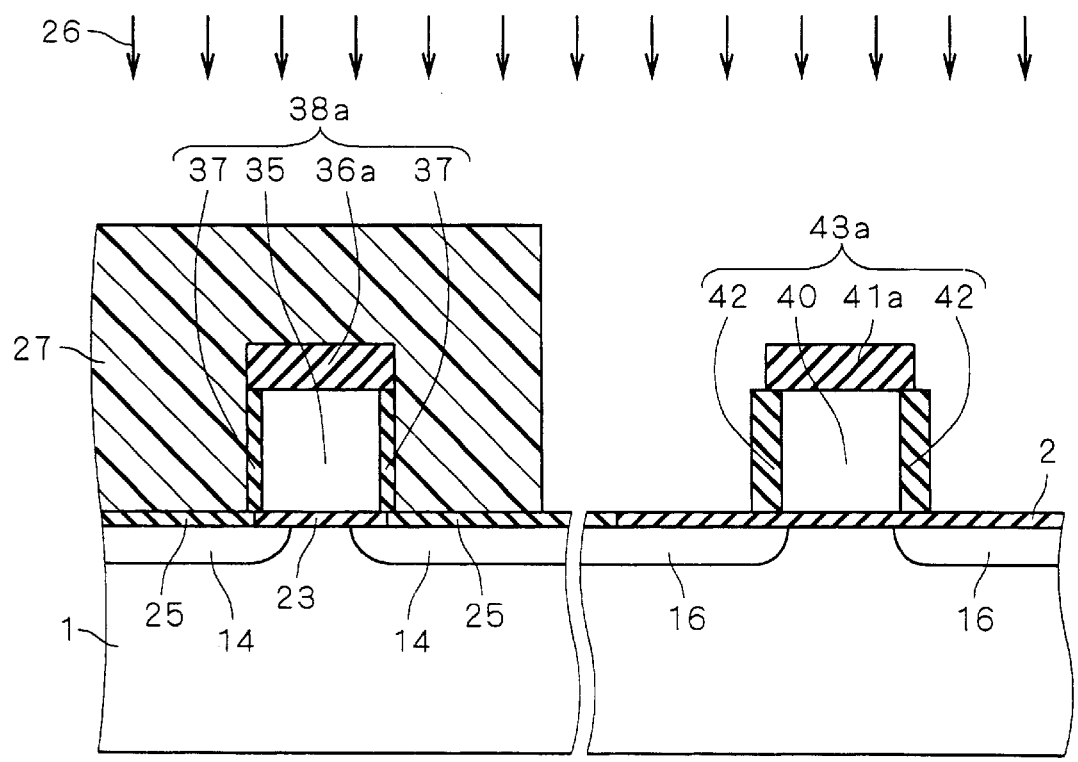
Figure 27:
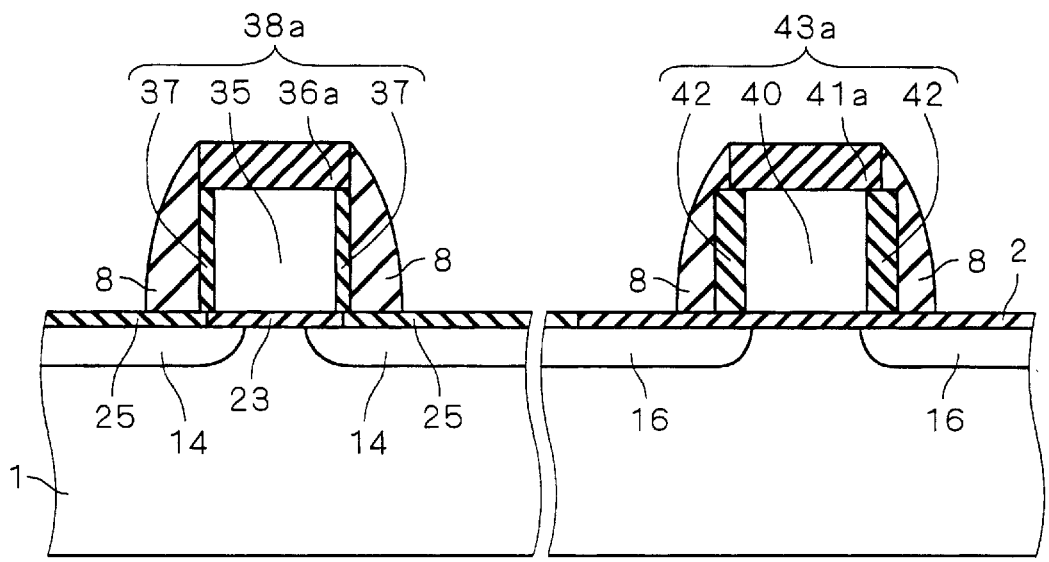

Referring to FIG. 26, by photolithography method, a photoresist 27 covering the gate structure 38a is formed on the first region of the silicon substrate 1. By using the gate structure 43a and photoresist 27 as an implantation mask, an n-type impurity 26 such as As is introduced into the main surface of the silicon substrate 1 by ion implantation method, thereby forming extensions 16. Referring to FIG. 27, after removing the photoresist 27, a sidewall 8 attached to the side surfaces of the gate structues 38a and 43a is formed.

Figure 28:
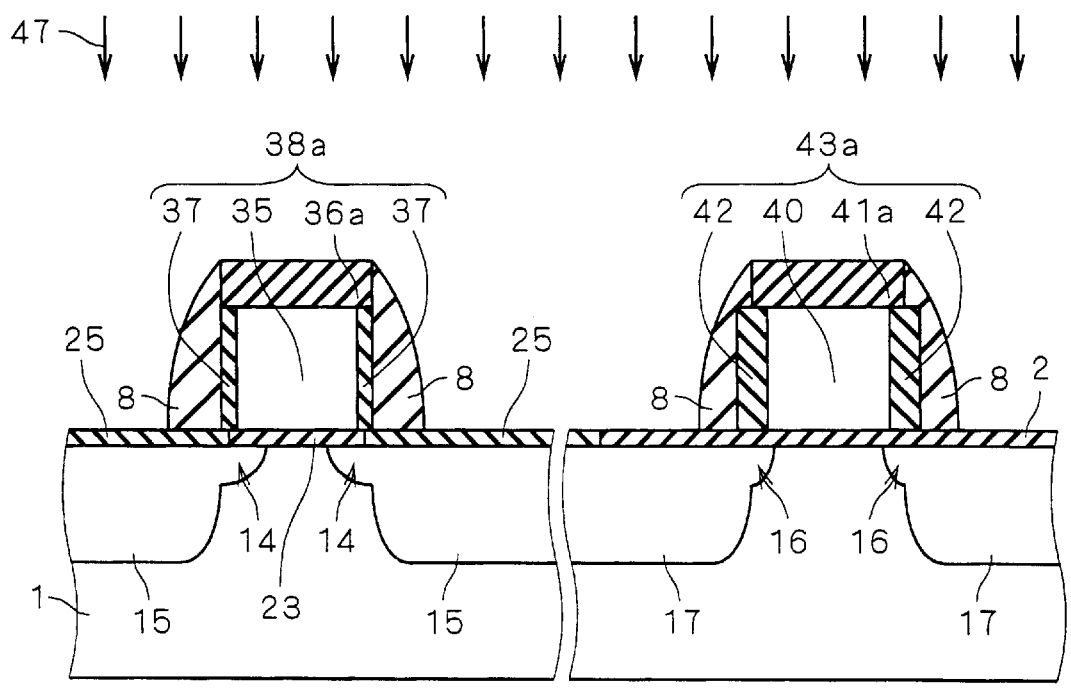

Referring to FIG. 28, by using the gate structures 38a, 43a and the sidewall 8 as an implantation mask, an n-type impurity 47 such as As is introduced into the main surface of the silicon substrate 1 by ion implantation method, thereby forming source/drain regions 15 and 17.

Portions of the silicon oxide film 2 which are exposed from the gate structures 38a, 43a and the sidewall 8, and the TEOS films 36a and 41a, are removed by wet etching method, and a cobalt film is formed on the entire surface. By a thermal treatment, the upper portions of the polysilicon films 35 and 40 are subjected to silicide formation reaction, thereby forming cobalt silicide films 36 and 41. By this thermal treatment, the exposed main surface of the silicon substrate 1 is also subjected to silicide formation reaction, thereby forming cobalt silicide films 39 and 44. The nonreacted cobalt film is then removed to obtain the structure shown in FIG. 19.

With the method of the third preferred embodiment, the sidewall oxide film 37 of a first width is formed in the first region of the silicon substrate 1, and the sidewall oxide film 42 of a second width is formed in the second region of the silicon substrate 1. Therefore, the amount of overlap between the extensions 14, 16 and the polysilicon films 35, 40 can be different from each other in the first and second regions of the silicon substrate 1. Even in a process flow that a polycide gate is formed by subjecting a polysilicon gate to silicide formation reaction, the effect of reducing the overlap capacity between the gate electrode and extensions can be adjusted individually according to demand of a circuit characteristic on which emphasis is placed.

Fourth Preferred Embodiment

Figure 29:
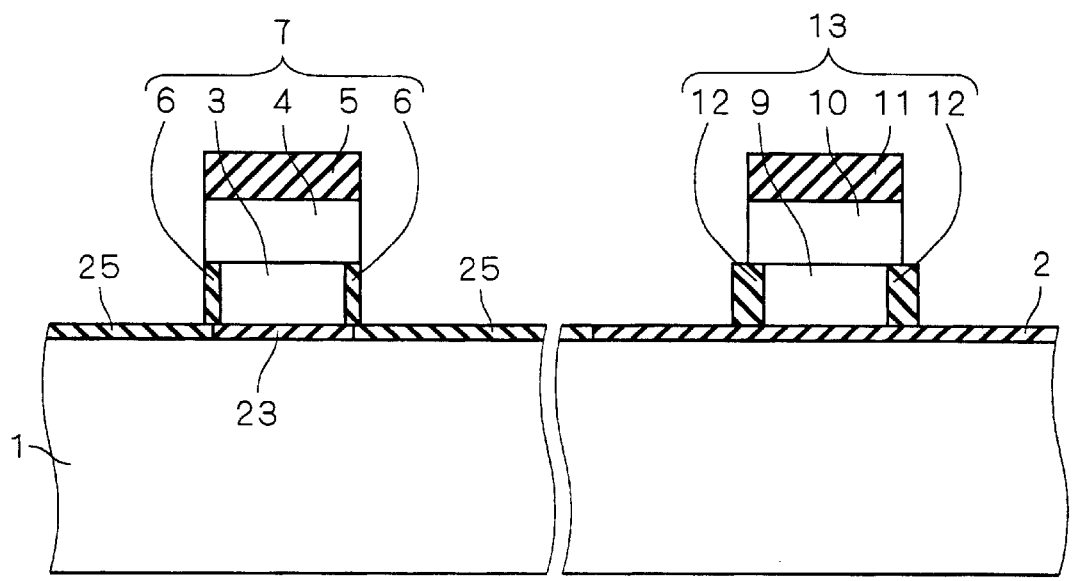
FIGS. 29 to 31 are sectional views illustrating a sequence of steps in a method of manufacturing a semiconductor device according to a fourth preferred embodiment.
Figure 30:
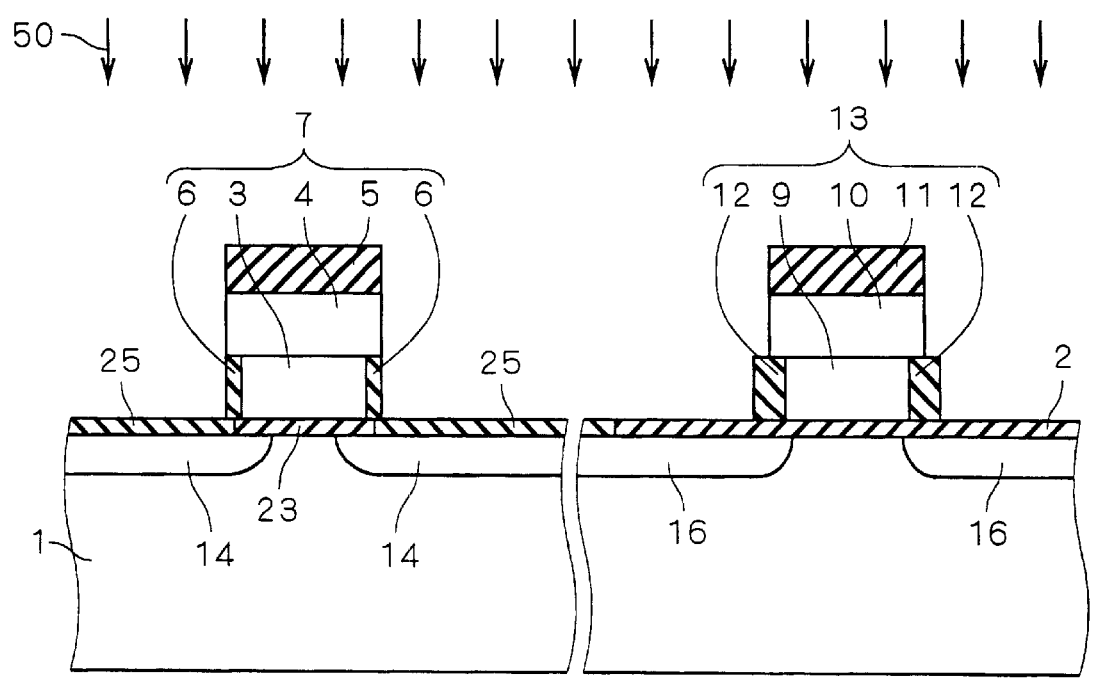
Figure 31:
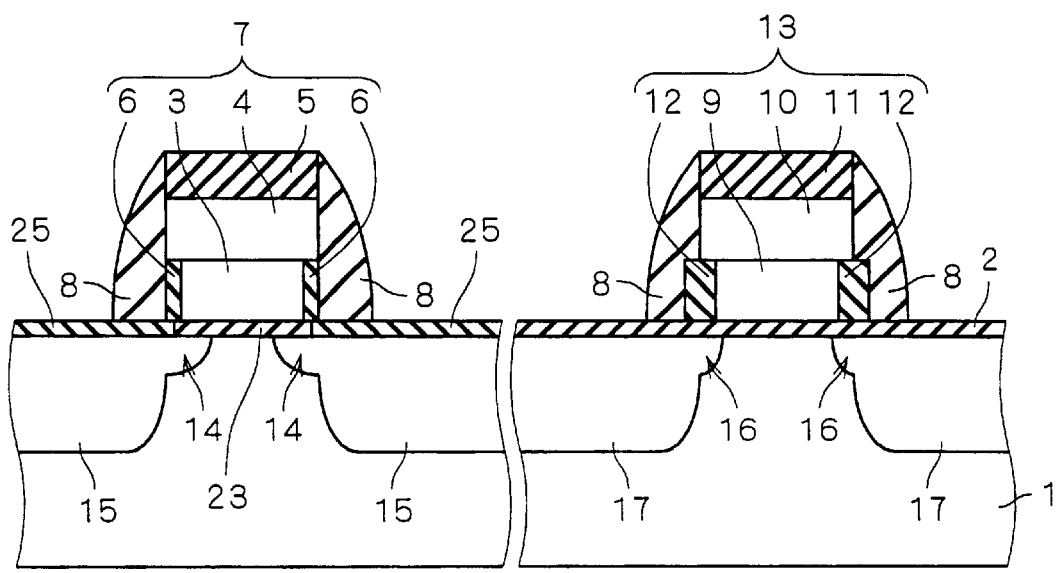

FIGS. 29 to 31 are sectional views illustrating a sequence of steps in a method of manufacturing a semiconductor device according to a fourth preferred embodiment. Firstly, the structure shown in FIG. 5 is obtained through the same steps as the method of the first preferred embodiment. Referring to FIG. 29, after removing a photoresist 22, a thermal oxidation is performed so that the side surface of a polysilicon film 3 is oxidized to form a sidewall oxide film 6. This results in a gate structure 7. By this thermal oxidization, a main surface in the first region of a silicon substrate 1 is oxidized to form a silicon oxide film 25. Further, by this thermal oxidation, a polysilicon film 9 is also oxidized, so that the width of the sidewall oxide film 21 is increased to become a sidewall oxide film 12. This results in a gate structure 13.

Referring to FIG. 30, by using the gate structures 7 and 13 as an implantation mask, an n-type impurity 50 such as As is introduced into the main surface of the silicon substrate 1 by ion implantation under condition of 8 keV and $1 \times 10^{14}$/cm$^2$. This results in that paired extensions 14 are formed in the main surface of the first region of the silicon substrate 1, and that paired extensions 16 are formed in the main surface of the second region of the silicon substrate 1.

Referring to FIG. 31, a sidewall 8 attached to the side surfaces of the gate structures 7 and 13 is formed. By using the gate structures 7, 13 and the sidewall 8 as an implantation mask, an n-type impurity such as As is introduced into the main surface of the silicon substrate 1 by ion implantation, thereby forming source/drain regions 15 and 17.

Although the case of applying the invention of the fourth preferred embodiment on the basis of the method of the first preferred embodiment has been described, the invention of the fourth preferred embodiment is applicable on the basis of the method of the second or third preferred embodiment.

With the method of the fourth preferred embodiment, like the method of the first preferred embodiment, a sidewall oxide film 6 of a first width is formed in the first region of the silicon substrate 1, and a sidewall oxide film 12 of a second width different from the first width is formed in the second region of the silicon substrate 1. Therefore, the amount of overlap between the extensions 14, 16 and the polysilicon films 3, 9 can be different from each other in the first and second regions of the silicon substrate 1. This enables to individually adjust the effect of reducing the overlap capacity between the gate electrode and extensions according to demand of a circuit characteristic, such as current driving capability and operation speed, on which emphasis is placed.

In addition, since the extension 14 in the first region of the silicon substrate 1 and the extensions 16 in the second region is formed simultaneously in one ion implantation step (FIG. 30), there is no need to form the photoresist 27 shown in FIGS. 8, 17 and 26. Therefore, the manufacturing steps can be simplified as compared to the methods of the first to third preferred embodiments.

Fifth Preferred Embodiment

Figure 32:
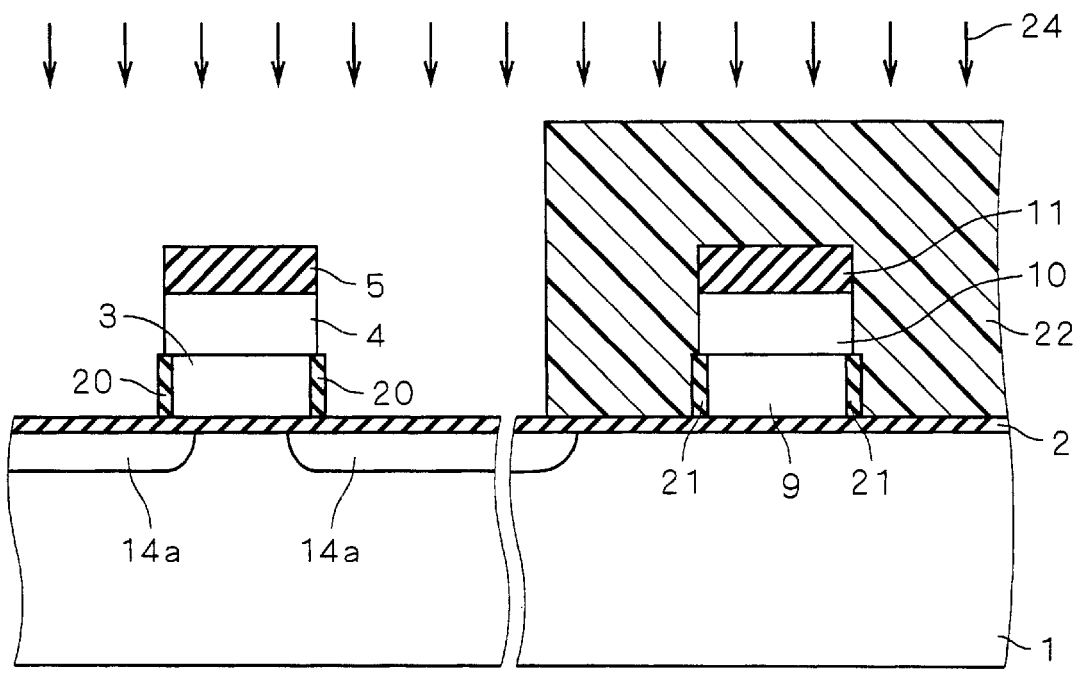
FIGS. 32 to 34 are sectional views illustrating a sequence of steps in a method of manufacturing a semiconductor device according to a fifth preferred embodiment.
Figure 33:
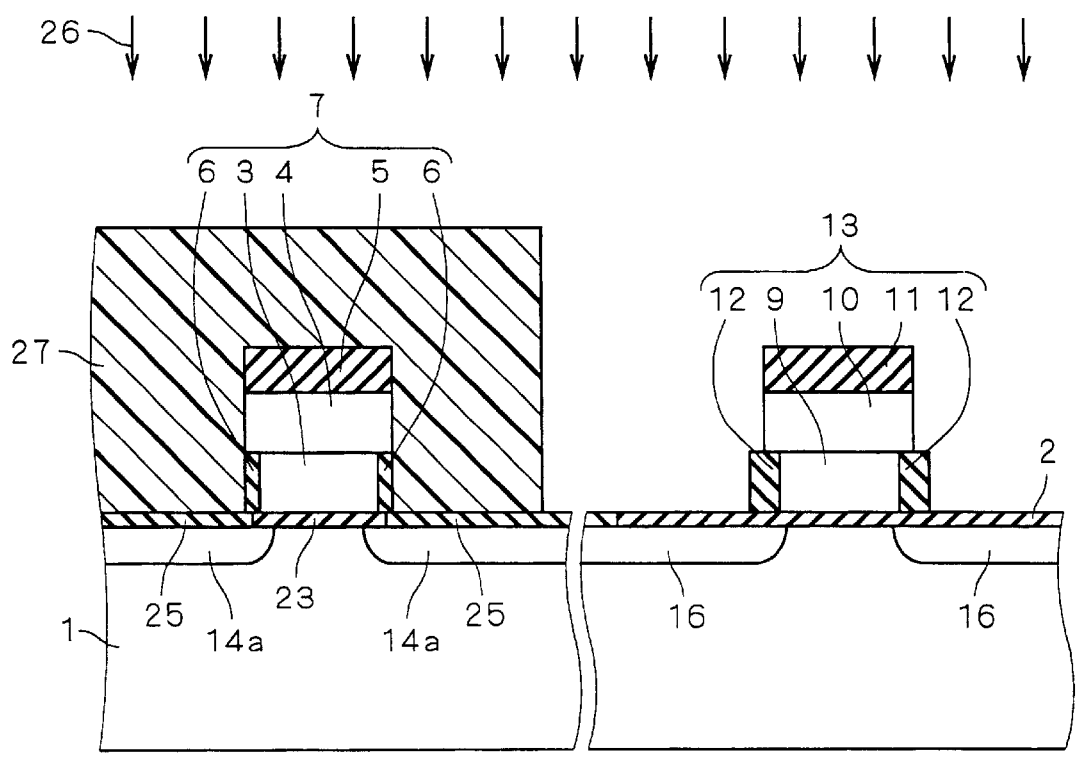
Figure 34:
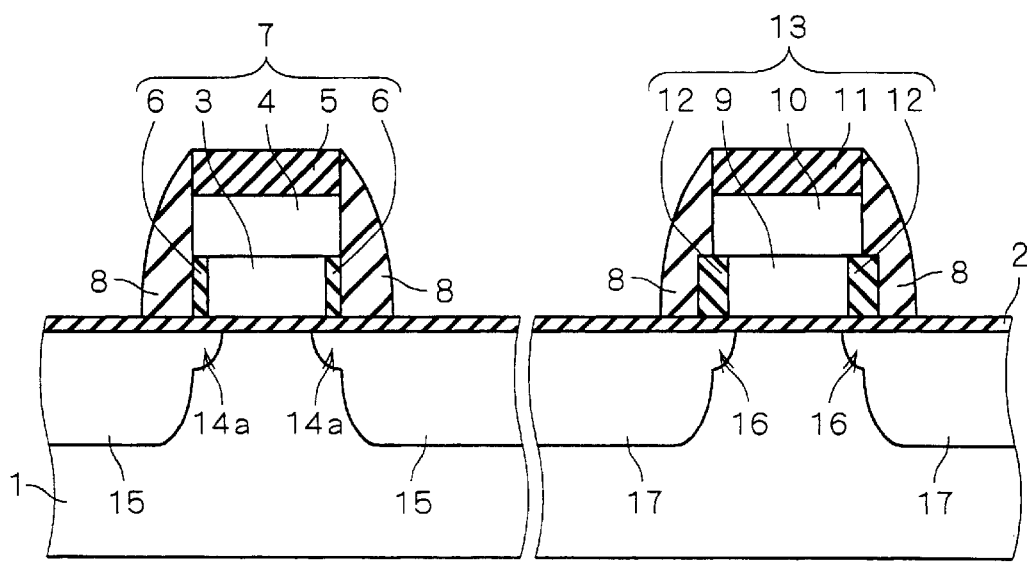

FIGS. 32 to 34 are sectional views illustrating a sequence of steps in a method of manufacturing a semiconductor device according to a fifth preferred embodiment. Firstly, the structure shown in FIG. 4 is obtained through the same steps as the method of the first preferred embodiment. Referring to FIG. 32, an n-type impurity 24 such as As is introduced into a main surface of a silicon substrate 1 by ion implantation method under condition of 8 keV and $5\times10^{13}/cm^2$, by using, as an implantation mask, a photoresist 22 and a structure made up of a polysilicon film 3, tungsten silicide film 4, silicon nitride film 5 and sidewall oxide film 20. Thereby, paired extensions 14a are formed in the main surface of a first region of the silicon substrate 1.

Subsequently, portions of the silicon oxide film 2 and sidewall oxide film 20 which are not covered with the photoresist 22 are removed. After removing the photoresist 22, a thermal oxidation is performed to form a sidewall oxide film 6, silicon oxide film 25 and sidewall oxide film 12.

Referring to FIG. 33, a photoresist 27 is formed on the first region of the silicon substrate 1 by photolithography method. By using a gate structure 13 and the photoresist 27 as an implantation mask, an n-type impurity 26 such as As is introduced into the main surface of the silicon substrate 1 by ion implantation method, thereby forming extensions 16.

Referring to FIG. 34, after removing the photoresist 27, a sidewall 8 attached to the side surfaces of the gate structures 7 and 13 is formed. By using the gate structures 7, 13 and the sidewall 8 as an implantation mask, an n-type impurity such as As is introduced into the main surface of the silicon substrate 1 by ion implantation method, thereby forming source/drain regions 15 and 17.

Although the case of applying the invention of the fifth preferred embodiment on the basis of the method of the first preferred embodiment has been described, the invention of the fifth preferred embodiment is applicable on the basis of the method of the second or third preferred embodiment.

With the method of the fifth preferred embodiment, like the method of the first preferred embodiment, a sidewall oxide film 6 of a first width is formed in the first region of the silicon substrate 1, and a sidewall oxide film 12 of a second width different from the first width is formed in the second region of the silicon substrate 1. Therefore, the amount of overlap between the extensions 14, 16 and the polysilicon films 3, 9 can be different from each other in the first and second regions of the silicon substrate 1. This enables to individually adjust the effect of reducing the overlap capacity between the gate electrode and extensions according to demand of a circuit characteristic, such as current driving capability and operation speed, on which emphasis is placed.

In addition, since the step of ion implantation for forming the extensions 14a is carried out before the step of removing the sidewall oxide film 20 (see FIG. 32), the spaced interval between the paired extensions 14a can be made wider by the width of the sidewall oxide film 20, than the spaced interval between the paired extensions 14 shown in FIGS. 6, 15 and 24. As a result, with the semiconductor device of the fifth preferred embodiment, the effective channel length ($L_{eff}$) of a first MOS transistor can be increased and the capacity of gate overlap can be more reduced, as compared to the semiconductor device of the first to third preferred embodiments.

Sixth Preferred Embodiment

A method of manufacturing a semiconductor device according to a sixth preferred embodiment is characterized by that in the step shown in FIG. 33 in the method of the fifth preferred embodiment, an ion implantation of n-type impurity 26 is performed without forming a photoresist 27.

Figure 35:
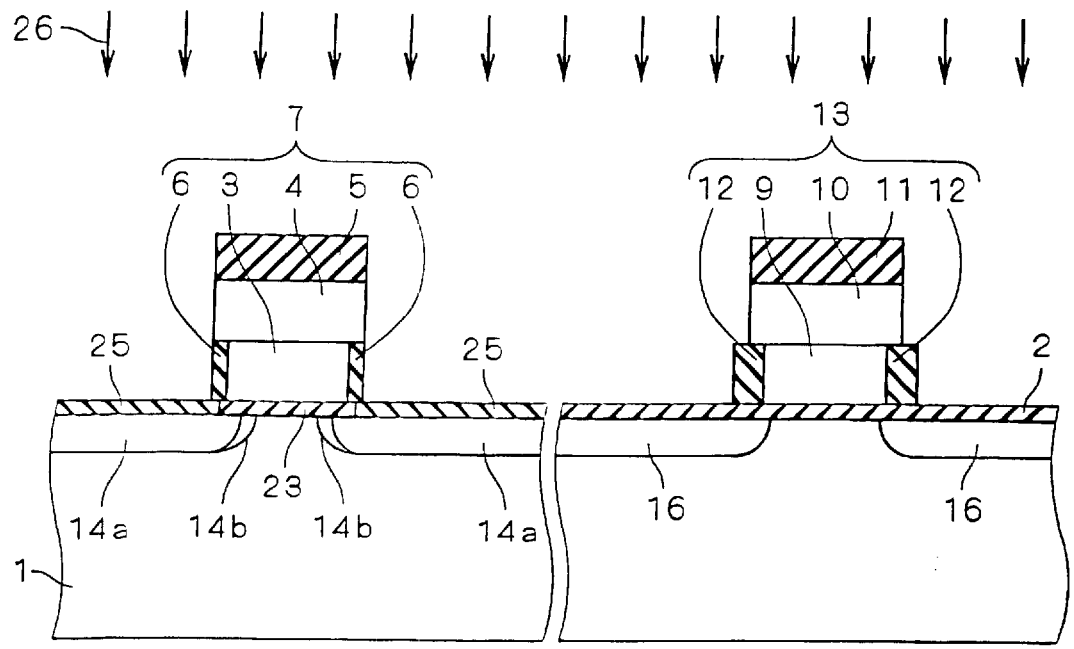
FIG. 35 is a sectional view illustrating one of the steps in a method of manufacturing a semiconductor device according to a sixth preferred embodiment.
Figure 36:
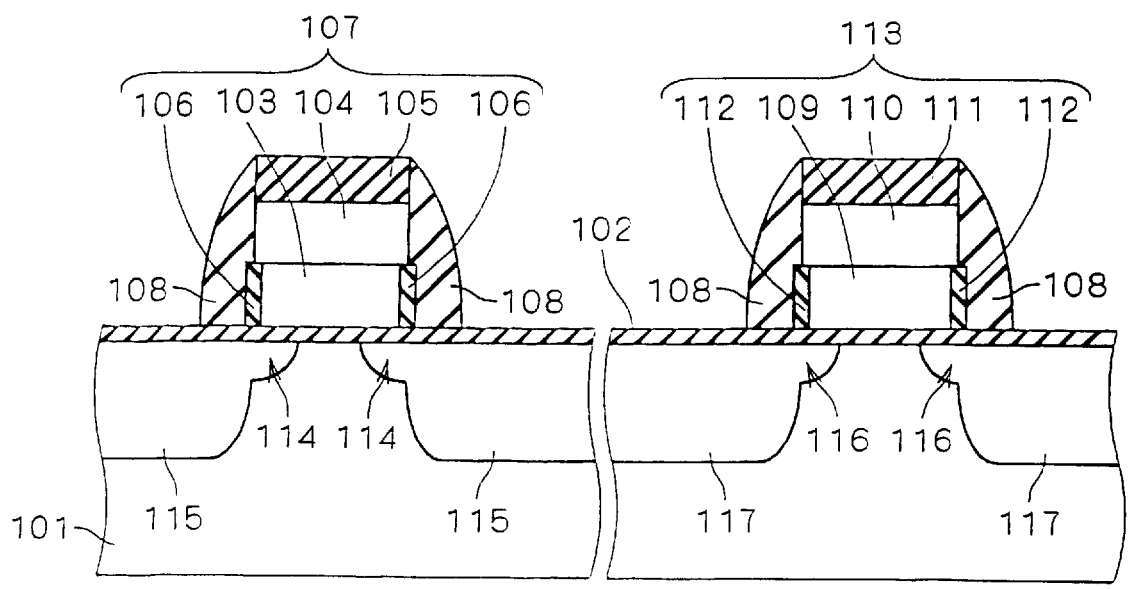
FIG. 36 is a sectional view illustrating a conventional structure of a semiconductor device.
Figure 37:
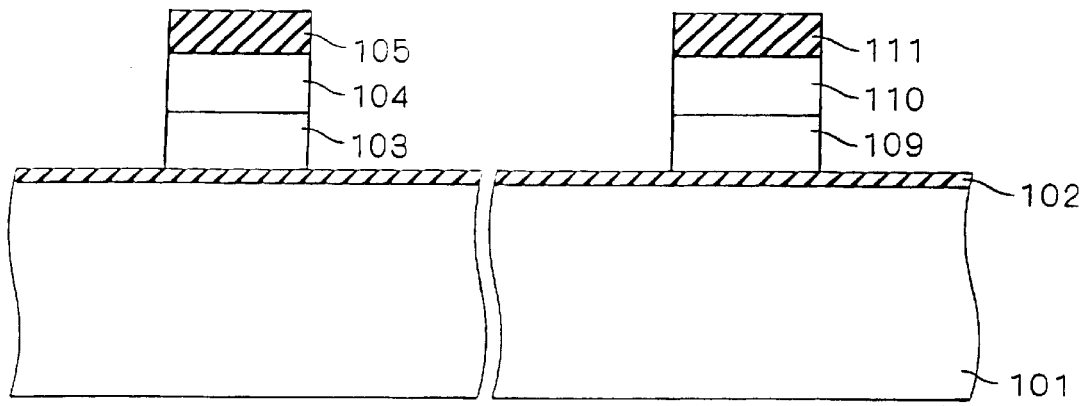
FIGS. 37 to 40 are sectional views illustrating a sequence of steps in a conventional method of manufacturing a semiconductor device.
Figure 38:
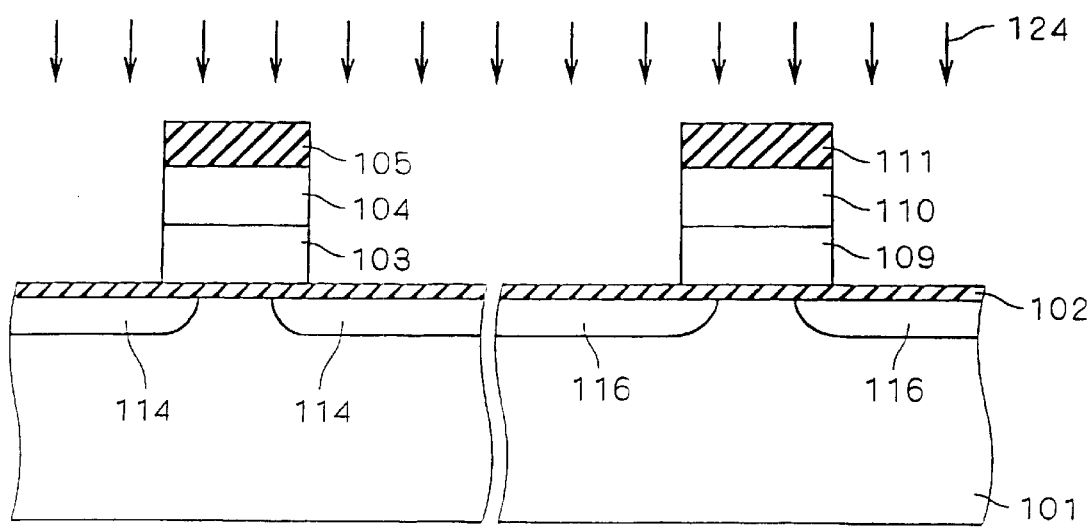
Figure 39:
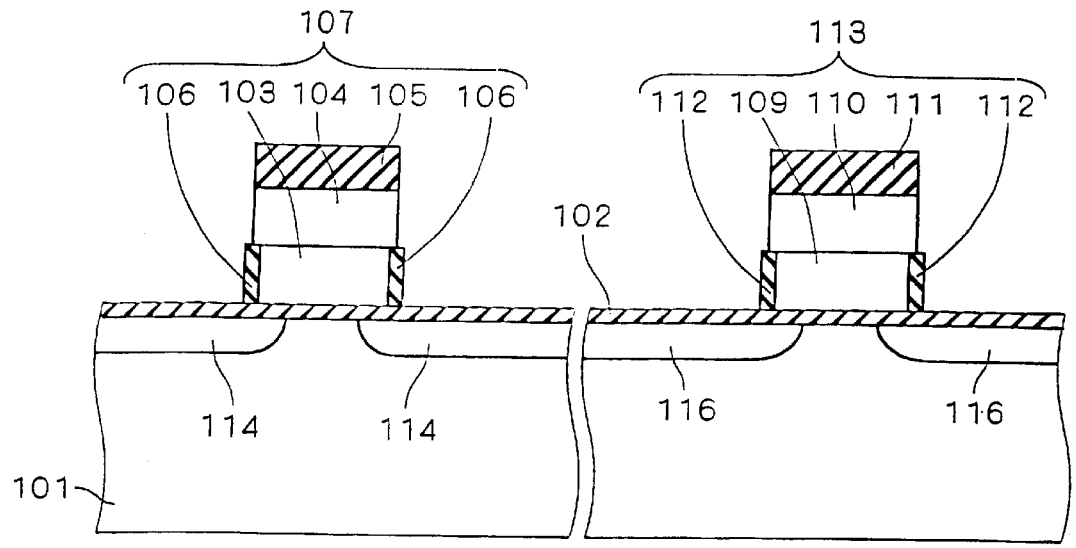
Figure 40:
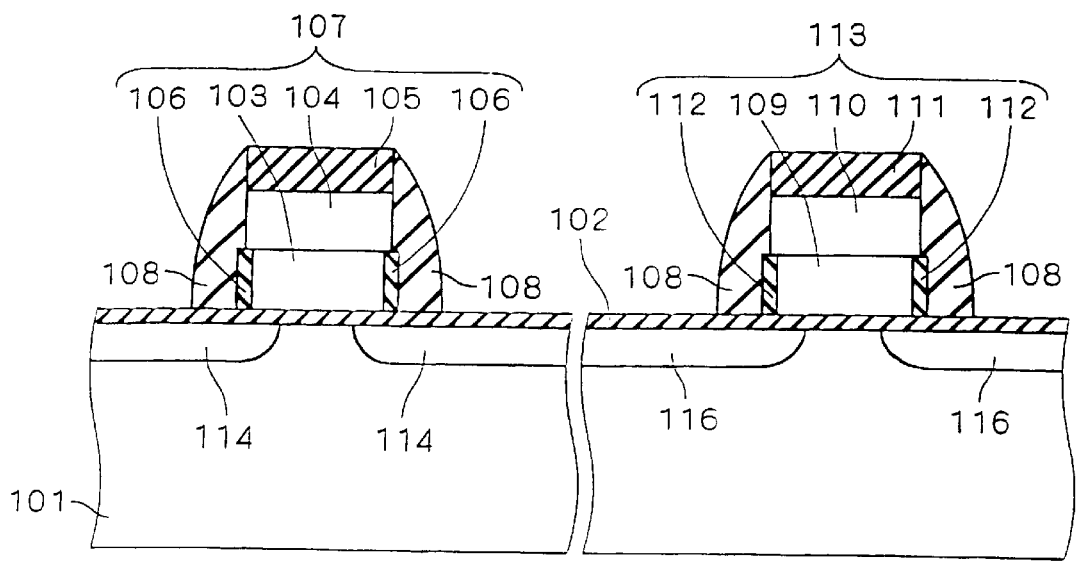

FIG. 35 is a sectional view of one step in the method of the sixth preferred embodiment. Firstly, the structure shown in FIG. 32 is obtained through the same steps as the method of the fifth preferred embodiment. Portions of a silicon oxide film 2 and sidewall oxide film 20 which are not covered with a photoresist 22 are removed. The photoresist 22 is then removed, and a thermal oxidation is performed to form a sidewall oxide film 6, silicon oxide film 25 and sidewall oxide film 12.

Referring to FIG. 35, by using gate structures 7 and 13 as an implantation mask, an n-type impurity 26 such as As is introduced into a main surface of a silicon substrate 1 by ion implantation method under condition of 8 keV and $1\times10^{14}/cm^2$. This results in that paired extensions 14b are formed in the main surface of the first region of the silicon substrate 1, and that paired extensions 16 are formed in the main surface of the second region of the silicon substrate 1.

Subsequently, a sidewall 8 is formed. By using the gate structures 7, 13 and the sidewall 8 as an implantation mask, an n-type impurity such as As is introduced into the main surface of the silicon substrate 1 by ion implantation method, thereby forming source/drain regions 15 and 17.

With the method of the sixth preferred embodiment, like the method of the first preferred embodiment, a sidewall oxide film 6 of a first width is formed in the first region of the silicon substrate 1, and a sidewall oxide film 12 of a second width different from the first width is formed in the second region of the silicon substrate 1. Therefore, the amount of overlap between the extensions 14a, 14b, 16 and the polysilicon films 3, 9 can be different from each other in the first and second regions of the silicon substrate 1. This enables to individually adjust the effect of reducing the overlap capacity between the gate electrode and extensions according to demand of a circuit characteristic, such as current driving capability and operation speed, on which emphasis is placed.

Further, in performing the step of ion implantation for forming the extensions 16 in the second region of the silicon substrate 1, there is no need to form a photoresist 27 (see FIG. 33) in the first region of the silicon substrate 1. This enables to simplify the manufacturing steps as compared to the method of the fifth preferred embodiment.

The same effect is obtainable in the method of the first preferred embodiment by forming extensions 14 in the step shown in FIG. 6, and performing an ion implantation of an n-type impurity 26 without forming a photoresist 27 in the step shown in FIG. 8.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a substrate of a first conductivity type;
   a first structure having a first conductive layer formed on a main surface in a first region of said substrate with a first insulating film formed between said substrate and said first conductive layer;
   a second structure having a second conductive layer formed on said main surface in a second region of said substrate with a second insulating film formed between said substrate and said second conductive layer;

a first sidewall oxide film of a first width formed on a side surface of said first conductive layer;

a second sidewall oxide film of a second width larger than said first width formed on a side surface of said second conductive layer;

a pair of first impurity regions of a second conductivity type sandwiching therebetween a portion of said substrate which underlines said first structure and being formed in said main surface in said first region of said substrate;

a pair of second impurity regions of said second conductivity type sandwiching therebetween another portion of said substrate which underlines said second structure and being formed in said main surface in said second region of said substrate; and a first transistor including said first structure and said pair of first impurity regions being a transistor having a greater emphasis on a current driving capability than an operation speed capability, and a second transistor including said second structure and said pair of second impurity regions being a transistor having a greater emphasis on the operation speed capability than the current driving capability, wherein an amount of overlap between said second conductive layer and said pair of second impurity regions in plan view is smaller than an amount of overlap between said first conductive layer and said pair of first impurity regions in said plan view, said first structure further has a third conductive layer formed on said first conductive layer and a length of said third conductive layer is greater than said first conductive layer, said second structure further has a fourth conductive layer formed on said second conductive layer and a length of said fourth conductive layer is greater than said second conductive layer, and said second sidewall oxide film projects from side surface positions of said fourth conductive layer.

2. The semiconductor device according to claim 1, wherein said first and second conductive layers are semiconductor layers, and said third and fourth conductive layers are metal layers.

3. The semiconductor device according to claim 1, wherein said first and second conductive layers are semiconductor layers, and said third and fourth conductive layers are metal-semiconductor compound layers.

* * * * *